US011646225B2

(12) United States Patent
Lee et al.

(10) Patent No.: US 11,646,225 B2
(45) Date of Patent: May 9, 2023

(54) SEMICONDUCTOR DEVICES AND METHODS OF FABRICATING THE SAME

(71) Applicant: Samsung Electronics Co., Ltd., Suwon-si (KR)

(72) Inventors: Myeong-Dong Lee, Seoul (KR); Keunnam Kim, Yongin-si (KR); Dongryul Lee, Suwon-si (KR); Minseong Choi, Seoul (KR); Jimin Choi, Hwaseong-si (KR); Yong Kwan Kim, Yongin-si (KR); Changhyun Cho, Yongin-si (KR); Yoosang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 318 days.

(21) Appl. No.: 17/039,431

(22) Filed: Sep. 30, 2020

(65) Prior Publication Data

US 2021/0020495 A1 Jan. 21, 2021

Related U.S. Application Data

(63) Continuation of application No. 16/238,172, filed on Jan. 2, 2019, now Pat. No. 10,796,950, which is a (Continued)

(30) Foreign Application Priority Data

Nov. 3, 2015 (KR) .......................... 10-2015-0154001

(51) Int. Cl.
*H01L 27/10* (2006.01)
*H01L 21/768* (2006.01)
(Continued)

(52) U.S. Cl.
CPC .... *H01L 21/7682* (2013.01); *H01L 21/76805* (2013.01); *H01L 21/76849* (2013.01);
(Continued)

(58) Field of Classification Search
CPC ........... H01L 21/7682; H01L 21/76805; H01L 21/76849; H01L 21/76895; H01L 23/5329;
(Continued)

(56) References Cited

U.S. PATENT DOCUMENTS 6,143,673 A * 11/2000 Jang .................. H01L 21/02274
257/E21.252
8,344,517 B2 1/2013 Kim et al.
(Continued)

FOREIGN PATENT DOCUMENTS

KR 10-2013-0022872 A 3/2013
KR 10-2014-0055183 A 5/2014
(Continued)

*Primary Examiner* — S M Sohel Imtiaz
(74) *Attorney, Agent, or Firm* — Muir Patent Law, PLLC

(57) ABSTRACT

According to some embodiments, a semiconductor device may include gate structures on a substrate; first and second impurity regions formed in the substrate and at both sides of each of the gate structures; conductive line structures provided to cross the gate structures and connected to the first impurity regions; and contact plugs connected to the second impurity regions, respectively. For each of the conductive line structures, the semiconductor device may include a first air spacer provided on a sidewall of the conductive line structure; a first material spacer provided between the conductive line structure and the first air spacer; and an insulating pattern provided on the air spacer. The insulating pattern may include a first portion and a second portion, and the second portion may have a depth greater than that of the first portion and defines a top surface of the air spacer.

20 Claims, 34 Drawing Sheets

Related U.S. Application Data continuation of application No. 15/334,469, filed on Oct. 26, 2016, now Pat. No. 10,211,091.

(51) Int. Cl.
*H01L 27/108* (2006.01)
*H01L 23/532* (2006.01)
*H01L 23/535* (2006.01)

(52) U.S. Cl.
CPC ...... *H01L 21/76895* (2013.01); *H01L 23/535* (2013.01); *H01L 23/5329* (2013.01); *H01L 27/10814* (2013.01); *H01L 27/10823* (2013.01); *H01L 27/10855* (2013.01); *H01L 27/10876* (2013.01)

(58) Field of Classification Search
CPC ............. H01L 23/535; H01L 27/10814; H01L 27/10823; H01L 27/10855; H01L 27/10876
See application file for complete search history.

(56) References Cited

U.S. PATENT DOCUMENTS

| | | | |
|---|---|---|---|
| 8,642,466 B2 | 2/2014 | Kim | |
| 8,906,775 B2 | 12/2014 | Cho et al. | |
| 9,006,078 B2 | 4/2015 | Kim | |
| 9,165,859 B2 | 10/2015 | Lim et al. | |
| 9,202,774 B2 | 12/2015 | Yeom et al. | |
| 9,257,437 B2 | 2/2016 | Park et al. | |
| 9,356,073 B1* | 5/2016 | Kim | H01L 23/528 |
| 2012/0276711 A1* | 11/2012 | Yoon | H01L 21/764 257/E21.573 |
| 2013/0056817 A1* | 3/2013 | Kim | H01L 27/11521 257/E27.081 |
| 2013/0292847 A1 | 11/2013 | Choi et al. | |
| 2014/0077333 A1* | 3/2014 | Son | H01L 21/764 438/421 |
| 2014/0217545 A1* | 8/2014 | Kim | H01L 27/10855 257/522 |
| 2014/0273287 A1* | 9/2014 | Park | H01L 43/12 438/3 |
| 2014/0291804 A1* | 10/2014 | Kim | G11C 11/4099 257/532 |
| 2015/0014759 A1* | 1/2015 | Lee | H01L 23/5226 257/306 |
| 2015/0061134 A1* | 3/2015 | Lee | H01L 21/7682 257/751 |
| 2015/0126013 A1* | 5/2015 | Hwang | H01L 27/10823 438/672 |
| 2016/0064270 A1 | 3/2016 | Lee et al. | |
| 2016/0181143 A1* | 6/2016 | Kwon | H01L 21/764 438/586 |
| 2016/0351501 A1* | 12/2016 | Chun | H01L 27/1085 |

FOREIGN PATENT DOCUMENTS

| | | |
|---|---|---|
| KR | 10-2014-0082281 A | 7/2014 |
| KR | 20150027363 A | 3/2015 |

* cited by examiner

US 11,646,225 B2

SEMICONDUCTOR DEVICES AND METHODS OF FABRICATING THE SAME

CROSS-REFERENCE TO RELATED APPLICATIONS

This U.S. non-provisional patent application is a continuation of and claims priority to U.S. patent application No. 16/238,172, filed on Jan. 2, 2019, which is a continuation of and claims priority to U.S. patent application Ser. No. 15/334,469, filed on Oct. 26, 2016, which claims priority under 35 U.S.C. § 119 to Korean Patent Application No. 10-2015-0154001, filed on Nov. 3, 2015 in the Korean Intellectual Property Office, the entire contents of each of which are hereby incorporated by reference.

BACKGROUND OF THE INVENTION

The present disclosure relates to semiconductor devices and methods of fabricating the same, and in particular, to semiconductor devices with an air spacer and methods of fabricating the same.

Due to their small-sized, multifunctional, and/or low-cost characteristics, semiconductor devices are being esteemed as important elements in the electronic industry. The semiconductor devices may memory devices for storing data, logic devices for processing data, or hybrid devices including both of memory and logic elements.

In general, a semiconductor device may include patterns vertically stacked on a substrate and contact plugs for electrically connecting the patterns to each other. An increase in an integration density of a semiconductor device may lead to a reduction in distance between the patterns and/or between the pattern and the contact plug. In this case, since parasitic capacitance between the patterns and/or between the pattern and the contact plug increases, a semiconductor device may suffer from deterioration in performance or operation speed.

SUMMARY

Some embodiments of the inventive concept provide semiconductor devices with improved electric characteristics and methods of fabricating the same.

According to some embodiments, a semiconductor device may include gate structures on a substrate; first and second impurity regions formed in the substrate and at both sides of each of the gate structures; conductive line structures provided to cross the gate structures and connected to the first impurity regions; and contact plugs connected to the second impurity regions, respectively. For each of the conductive line structures, the semiconductor device may include a first air spacer provided on a sidewall of the conductive line structure; a first material spacer provided between the conductive line structure and the first air spacer; and an insulating pattern provided on the air spacer. The insulating pattern may include a first portion and a second portion, and the second portion may have a depth greater than that of the first portion and defines a top surface of the air spacer.

According to some embodiments, a semiconductor device includes gate structures on a substrate; first and second impurity regions formed in the substrate and at both sides of each of the gate structures; conductive line structures provided to cross the gate structures and connected to the first impurity regions; contact plugs connected to the second impurity regions, respectively; at least a first air spacer provided on a sidewall of each of the conductive line structures; a barrier layer provided to cover the conductive line structures and the air spacers; and for each conductive line structure, an insulating pattern provided on the barrier layer, the insulating pattern including at least a portion in contact with the first air spacer. A bottom surface of the insulating pattern comprises a portion which defines a top surface of the first air spacer and is lower than a bottom surface of the barrier layer.

According to some embodiments, a semiconductor device includes a plurality of gate structures on a substrate; for each gate structure, first and second impurity regions formed in the substrate and at opposite sides of the gate structure; a plurality of conductive line structures provided to cross the gate structures and connected to the first impurity regions; a plurality of contact plugs, each connected to a respective second impurity regions, respectively; and for each of the plurality of conductive line structures: first and second material spacers provided on a first sidewall of the conductive line structure; a first air spacer provided on the first sidewall of the conductive line structure, and disposed between the first material spacer and the second material spacer; third and fourth material spacers provided on a second sidewall of the conductive line structure; and a second air spacer provided on the second sidewall of the conductive line structure, and disposed between the third material spacer and the fourth material spacer. When viewed in a vertical section parallel to the gate structure, the first air spacer has a smaller vertical length than that of the second air spacer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A to 12A are plan views illustrating a method of fabricating a semiconductor device according to some embodiments of the inventive concept.

FIGS. 2B to 12B are sectional views taken along lines I-I' of FIGS. 2A to 12A, respectively.

FIGS. 2C to 12C are sectional views taken along lines II-II' of FIGS. 2A to 12A, respectively.

Figure 1A:
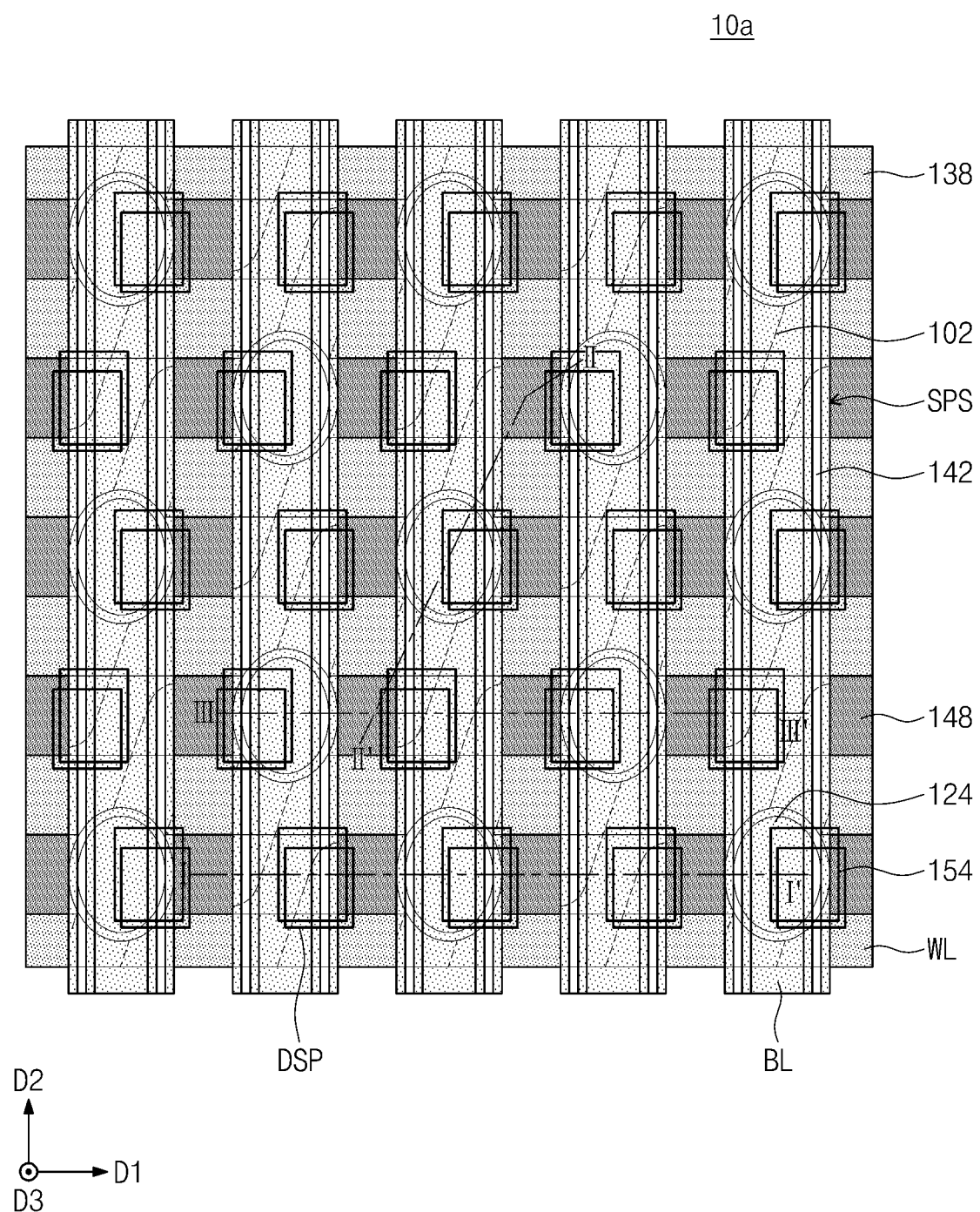
FIG. 1A is a plan view illustrating a semiconductor device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other. For example, the terms "first," "second," "third," and "fourth" may be used in the claims in connection with certain features such as spacers as a mere naming convention to more easily recite the claim features.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The term "air" as discussed herein, may refer to atmospheric air, or other gases that may be present during the manufacturing process.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Figure 1B:
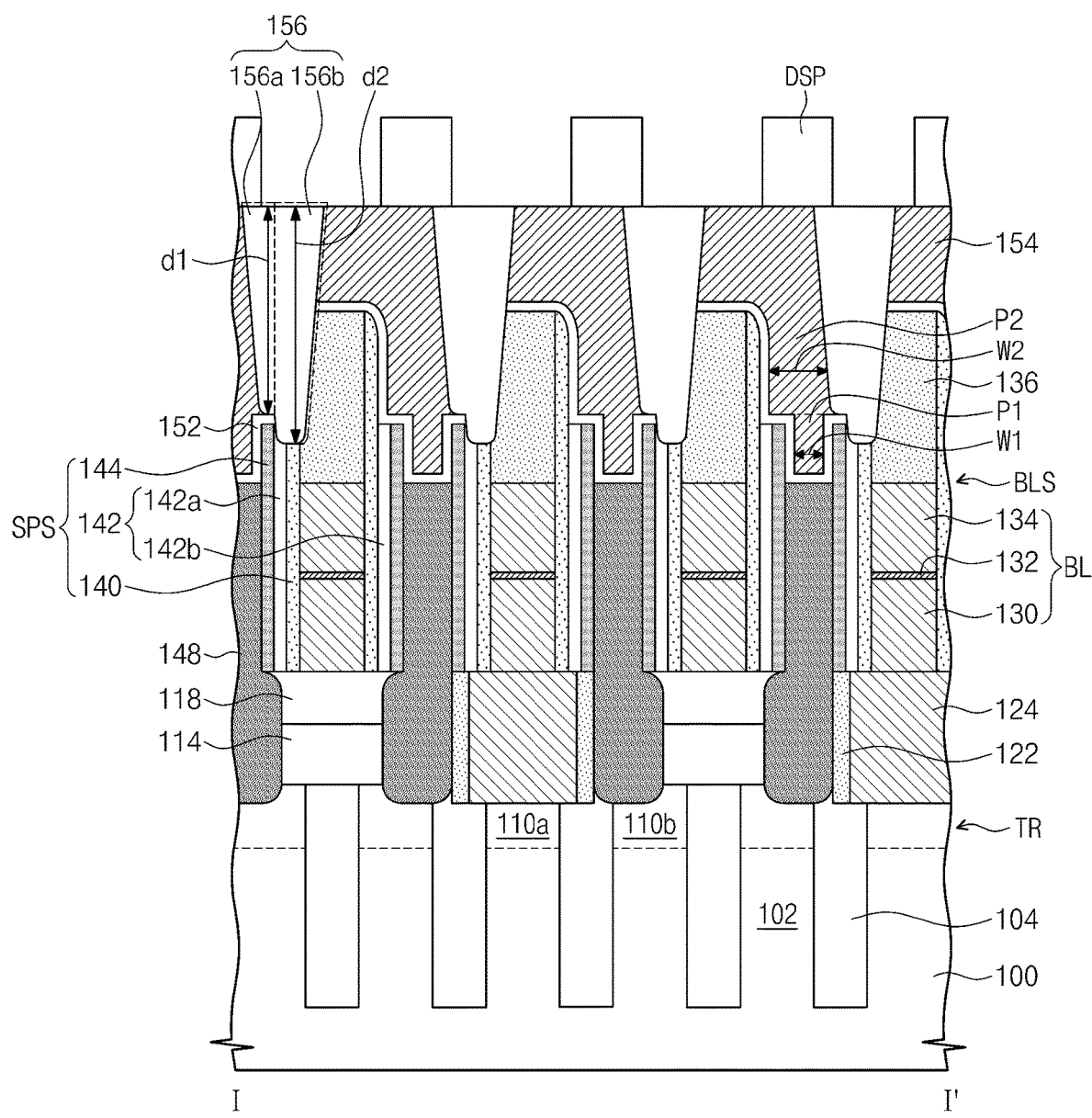
FIGS. 1B, 1C, and 1D are sectional views taken along lines I-I', II-II', and III-III', respectively, of FIG. 1A.
Figure 1C:
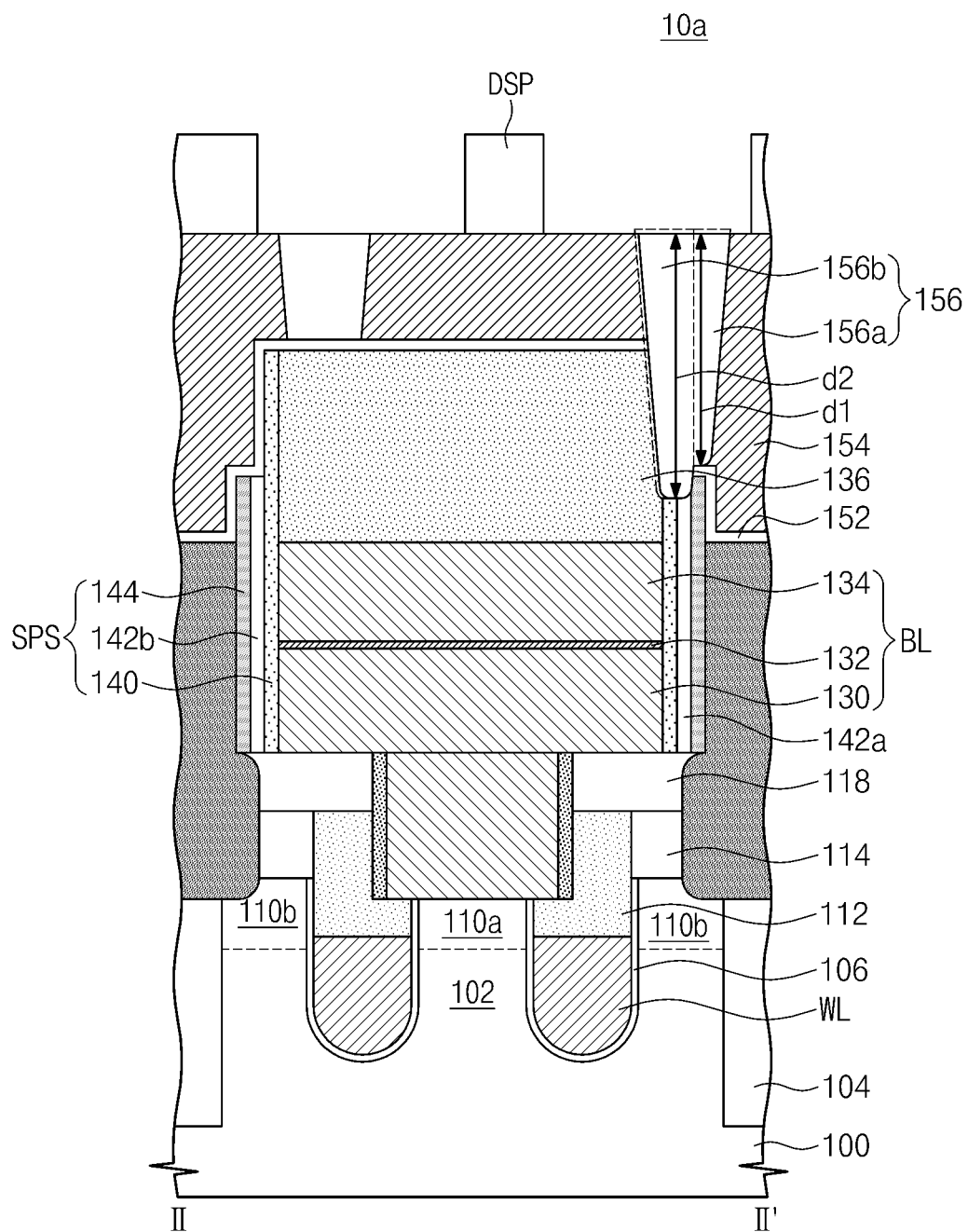
Figure 1D:
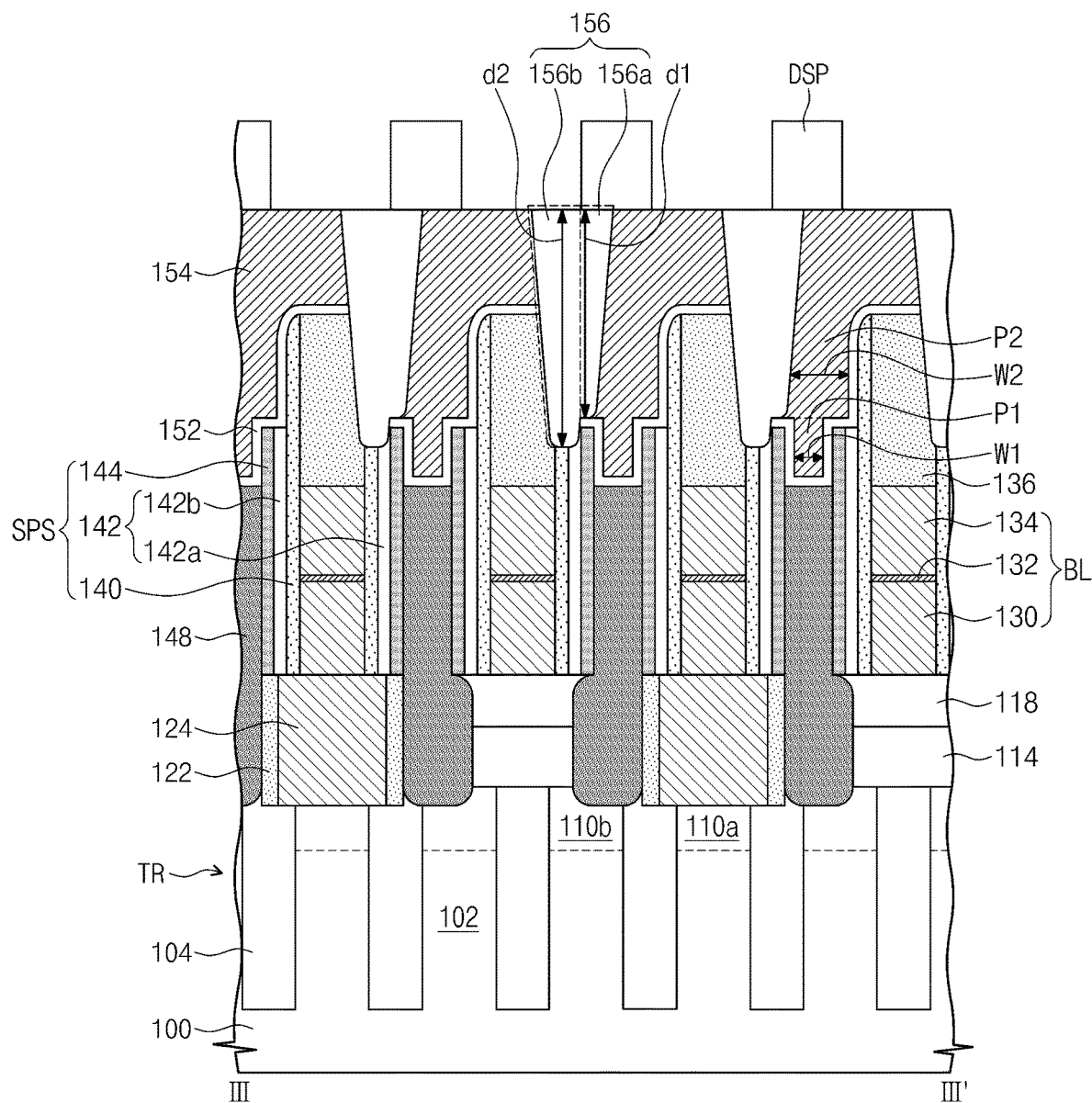

FIG. 1A is a plan view illustrating a semiconductor device according to some embodiments of the inventive concept. FIGS. 1B, 1C, and 1D are sectional views taken along lines I-I', II-II', and III-III', respectively, of FIG. 1A. Referring to FIGS. 1A to 1D, a semiconductor device 10a may include a substrate 100, transistors TR, conductive line structures BLS, spacer structures SPS, contact plugs 148, a barrier layer 152, landing pads 154, and an insulating pattern 156.

Device isolation layers 104 may be provided on the substrate 100 to define active regions 102. Each of the active regions 102 may have an isolated shape. For example, each of the active regions 102 may be shaped like an elongated bar, when viewed in a plan view. The active regions 102 may be portions of the substrate 100 enclosed by the device isolation layers 104. The substrate 100 may be formed of or include a semiconductor material. For example, the substrate 100 may be a silicon wafer, a germanium wafer, or a silicon-germanium wafer. The device isolation layers 104 may be formed of or include at least one of oxides (e.g., silicon oxide), nitrides (e.g., silicon nitride), or oxynitrides (e.g., silicon oxynitride).

Each of the transistors TR may include a gate insulating layer 106, a gate electrode WL, a gate capping pattern 112, and first and second impurity regions 110a and 110b. For example, the transistor TR may be formed to have a channel region positioned below a top surface of the substrate 100; for example, the transistor TR may have a buried channel array transistor (BCAT) structure. However, the inventive concept is not limited to the example, in which the transistor TR has the BCAT structure. The gate insulating layer 106 may be provided to cover inner surfaces of recess regions 105 (see FIG. 2C). The gate insulating layer 106 may be formed of or include at least one of insulating materials (e.g., silicon oxide, silicon oxynitride, hafnium oxide, aluminum oxide, or zirconium oxide).

In some embodiments, the semiconductor device may include a plurality of memory devices, which are connected to word and bit lines, and the gate electrode WL may serve as the word line. Hereinafter, the gate electrode WL may be referred to as a 'word line WL'. The semiconductor device may include a plurality of word lines WL, each of which is provided to cross the active regions 102. The word lines WL may extend in a first direction D1. The word lines WL may be provided in the recess regions 105, which are formed in the device isolation layers 104 and the active regions 102. For example, the word line WL may be provided to fill the recess region 105 provided with the gate insulating layer 106. The word lines WL may be formed of or include a conductive material. For example, the word lines WL may include doped polysilicon, metals (e.g., tungsten or copper), or metal compounds (e.g., titanium nitride).

The gate capping patterns 112 may be provided on the word lines WL, respectively. The gate capping patterns 112 may be provided to fill upper regions of the recess regions 105 provided with the word lines WL. Each of the gate capping patterns 112 may be a line-shaped structure extending in a longitudinal direction of the word line WL and may cover a top surface of the word line WL. The gate capping patterns 112 may have top surfaces that are higher than or coplanar with the top surface of the substrate 100. The gate capping patterns 112 may be formed of or include at least one of silicon oxide, silicon nitride, or silicon oxynitride. The gate capping pattern 112 may constitute part of a gate structure provided in the recess region 105. The gate structure may include the gate electrode and the gate capping pattern 112.

A first impurity region 110a may be formed in each active region 102 and between each pair of the word lines WL, and a pair of second impurity regions 110b may be formed in opposite edge regions of each active region 102. In an adjacent pair of transistors TR, the first impurity region 110a may be used as a common drain region, and the second impurity regions 110b may be used as source regions, respectively.

Bit line contact plugs 124 may be provided to electrically connect the first impurity regions 110a of the transistors TR to the bit line structures BLS. Each of the bit line contact plugs 124 may include at least one of doped polysilicon, metals (e.g., tungsten or copper), or metal compounds (e.g., titanium nitride). Contact spacers 122 may be provided to enclose the bit line contact plugs 124, respectively. In some embodiments, the bit line contact plug 124 may be shaped like a pillar, and each of the contact spacers 122 may be provided to cover an outer side surface of a corresponding one of the bit line contact plugs 124. The contact spacer 122 may be formed of or include at least one of silicon oxide, silicon nitride, or silicon oxynitride.

Each of the conductive line structures BLS may include a conductive line BL and a hard mask pattern 136. The conductive line BL may serve as the bit line BL. Hereinafter, the conductive line structure BLS may be referred to as a 'bit line structure BLS', and the conductive line BL may be referred to as a 'bit line BL'.

The bit line BL may be electrically connected to the first impurity regions 110a of the transistors TR through the bit line contact plugs 124. In some embodiments, a plurality of bit lines BL may be provided to be parallel to each other and extend in a second direction D2 perpendicular to the first direction D1. The bit line BL may include a first conductive pattern 130, a second conductive pattern 132, and a third conductive pattern 134, which are sequentially stacked on the substrate 100. In some embodiments, the first conductive pattern 130 may be formed of or include doped polysilicon, the second conductive pattern 132 may be formed of or include at least one of silicides (e.g., cobalt silicide or titanium silicide) or nitrides (e.g., aluminum titanium nitride), and the third conductive pattern 134 may be formed of or include tungsten silicide or tungsten. Although the bit line BL is illustrated to have a multi-layered structure including three layers, the bit line BL may have a single layered structure or any other multi-layered structure.

The hard mask pattern 136 may be disposed on the bit line BL. For example, the hard mask pattern 136 may extend in the second direction D2. The hard mask pattern 136 may be formed of or include at least one of silicon oxide, silicon nitride, or silicon oxynitride.

The spacer structures SPS may be disposed on sidewalls of the bit line structures BLS, respectively. Each of the spacer structures SPS may include a first spacer 140, an air spacer 142, and a second spacer 144. The spacer structures SPS may extend in a third direction D3 that is perpendicular to both of the first and second directions D1 and D2. The first spacer 140 may be provided to cover the sidewalls of the bit line structures BLS, and may contact the sidewalls of the bit line structures BLS. The air spacer 142 may be formed between the first spacer 140 and the second spacer 144. When viewed in a plan view, the air spacer 142 may extend in the second direction D2 and may have a linear shape. The second spacer 144 may be provided to face the first spacer 140 with the air spacer 142 interposed therebetween. At at least one side of the bit line structure BLS, the air spacer 142 and the second spacer 144 may have heights, and/or vertical lengths smaller than that of the first spacer 140. In one embodiment, at this side of the bit line structure BLS, the heights of the air spacer 142 and second spacer 144 may be the same. Accordingly, a top portion of the spacer structure SPS may have a relatively reduced width, and as a result, a contact margin between the landing pads 154 and the contact plug 148, and a thickness in a horizontal direction of the landing pad 154 adjacent to the bit line structure BLS may be increased. For example, as can be seen in FIGS. 1B and 1D, the landing pad 154 has a first portion P1 at a same vertical height as a portion of each of the first and second air spacers, and a has second portion P2 at a vertical height above both the first air spacer and the second air spacer. The first portion P1 has a first width W1 in a first direction (e.g., D1 direction) and the second portion P2 has a second width W2 in the first direction that is greater than the first width W1. Because the shape of the landing pad 154 is thicker at the top than if the air spacer 142 and second spacer 144 had extended to the same height as the first spacer 140, this increases the contact margin for the landing pad 154.

The first spacer 140 may be formed of an insulating material capable of preventing the bit lines BL from being oxidized. Also, the first spacer 140 may be formed of an insulating material capable of preventing metal atoms in the bit lines BL from being diffused. For example, the first spacer 140 may be formed of or include at least one of nitride or oxynitride materials (e.g., silicon nitride or silicon oxynitride). Similarly, the second spacer 144 may be formed of or include at least one of nitride or oxynitride materials (e.g., silicon nitride or silicon oxynitride).

Referring to FIGS. 1B to 1D, the air spacer 142 may include a first air spacer 142a and a second air spacer 142b. The first and second air spacers 142a and 142b may be provided at opposite sides of each of the bit line structures BLS and may face each other through the bit line structures BLS. The first air spacer 142a may be vertically recessed to have a top that is lower than that of the second air spacer 142b. Accordingly, the first air spacer 142a may have a height (e.g., a vertical length) smaller than that of the second air spacer 142b. As an example, the first air spacer 142a may be shorter by about 50 Å to about 200 Å than the second air spacer 142b, and/or may be between about 60% and about 95% of the height of the second air spacer 142b. As shown in FIGS. 1B and 1D, positions of the first and second air spacers 142a and 142b on even numbered ones of the word line WL may be different from those on odd numbered ones of the word lines WL. For example, the first and second air spacers 142a and 142b on even numbered ones of the word line WL may be positioned at left and right sides, respectively, of the bit line BL, whereas the first and second air spacers 142a and 142b on odd numbered ones of the word line WL may be positioned at right and left sides, respectively, of the bit line BL. At a first side of each bit line BL, a first air spacer 142a and its adjacent first spacer 140 (e.g., first air spacer 142a and the spacer adjacent to it and between the first air spacer 142a and the bit line BL) may have a top surface that is continuous and has a curved profile shape. The first air spacer 142a may have a higher top surface than its adjacent first spacer 140. At a second, opposite side of each bit line BL, a second air spacer 142b and its adjacent first spacer 140 may have top surfaces that are discontinuous and not coplanar. In addition, the second air spacer 142b may have a top surface that is lower than the top surface of its adjacent first spacer 140. Further still, the second air spacer 142b may have a top surface that is flat and coplanar with its adjacent second spacer 144, but the first air spacer 142a may have a top surface that is curved and not coplanar with its adjacent second spacer 144.

Each of the contact plugs 148 may connect one of the second impurity regions 110b electrically to a corresponding one of data storage patterns DSP. For example, the second impurity region 110b may be electrically connected to the data storage pattern DSP through the contact plug 148 and the landing pad 154. Each of the contact plugs 148 may extend in the third direction D3. The contact plugs 148 may have top surfaces lower than those of the air spacer 142 and the second spacer 144. Each of the contact plugs 148 may be provided to have an upper width smaller than its lower width. As an example, the contact plug 148 may include a pillar-shaped upper portion and a ball-shaped lower portion. The contact plugs 148 may include at least one of doped polysilicon, metals (e.g., tungsten or copper), or metal compounds (e.g., titanium nitride). In certain embodiments, a void may be formed in the lower portion of the contact plug 148.

A mold pattern 138 may be provided between an adjacent pair of the bit lines BL and between an adjacent pair of the contact plugs 148. The mold pattern 138 may be formed of or include at least one of silicon oxide, silicon nitride, or silicon oxynitride. As shown in FIG. 1A, spacers may be formed between the mold pattern 138 and the bit line BL.

The barrier layer 152 may be provided to at least partially cover the contact plugs 148, the spacer structures SPS, the bit line structures BLS, and the mold pattern 138. The barrier layer 152 may be conformally formed on the contact plugs 148, the spacer structures SPS, and the bit line structures BLS. The barrier layer 152 may be formed of or include, for example, titanium nitride.

The landing pads 154 may be provided on the barrier layer 152. The data storage patterns DSP may be electrically connected to the second impurity regions 110b through the landing pads 154. The landing pads 154 may be formed of or include at least one of doped semiconductor materials (e.g., doped silicon), metals (e.g., tungsten, titanium and/or tantalum), conductive metal nitrides (e.g., titanium nitride, tantalum nitride, and/or tungsten nitride), or metal-semiconductor compounds (e.g., metal silicide).

The insulating pattern 156 may be provided to fill gaps between the landing pads 154 and to define the landing pads 154. The insulating pattern 156 may have a top surface that is substantially coplanar with top surfaces of the landing pads 154. The insulating pattern 156 may be formed of or include, for example, silicon oxide.

Referring to FIGS. 1B to 1D, the insulating pattern 156 may include a first portion 156a and a second portion 156b. The first portion 156a and second portion 156b may comprise the entire insulating pattern 156, with the first portion 156a being only on one side of the second portion 156b, wherein a bottom-most surface of the first portion 156a is higher than a bottom-most surface of the second portion 156b. As can be seen in FIGS. 1B and 1D, the bottom of the second portion 156b may define the top of the air spacer 142. When measured from a top surface of the insulating pattern 156, the first portion 156a may have a first depth d1, and the second portion 156b may have a second depth d2. The second depth d2 may be greater than the first depth d1. For example, the second depth d2 may be greater by about 50 Å to about 500 Å than the first depth d1. In some embodiments, the first depth d1 may be between about 80% and about 95% of the second depth d2. As shown in FIGS. 1B to 1D, a bottom surface of the first portion 156a may be in contact with the barrier layer 152, and a bottom surface of the second portion 156b may be in contact with the air spacer 142. For example, the bottom surface of the second portion 156b may be in contact with the first air spacer 142a. The second portion 156b may be provided to be adjacent to, and may contact, the bit line structure BLS, compared with the first portion 156a. When viewed in a plan view, the second portion 156b may overlap the air spacer 142. For example, the second portion 156b may overlap the first air spacer 142a. The bottom surface of the second portion 156b may be rounded at a top of the first air spacer 142a.

The data storage patterns DSP may be formed on the contact plugs 148, respectively. The data storage patterns DSP may be electrically connected to the second impurity regions 110b, respectively, through the contact plugs 148.

In some embodiments, the data storage pattern DSP may be a capacitor. In certain embodiments, the data storage pattern DSP may include one of magnetic tunnel junctions, transition metal oxides, or phase-changeable materials.

FIGS. 2A to 12A are plan views illustrating a method of fabricating a semiconductor device according to some embodiments of the inventive concept. FIGS. 2B to 12B are sectional views taken along lines I-I' of FIGS. 2A to 12A, respectively. FIGS. 2C to 12C are sectional views taken along lines II-II' of FIGS. 2A to 12A, respectively.

Figure 2A:
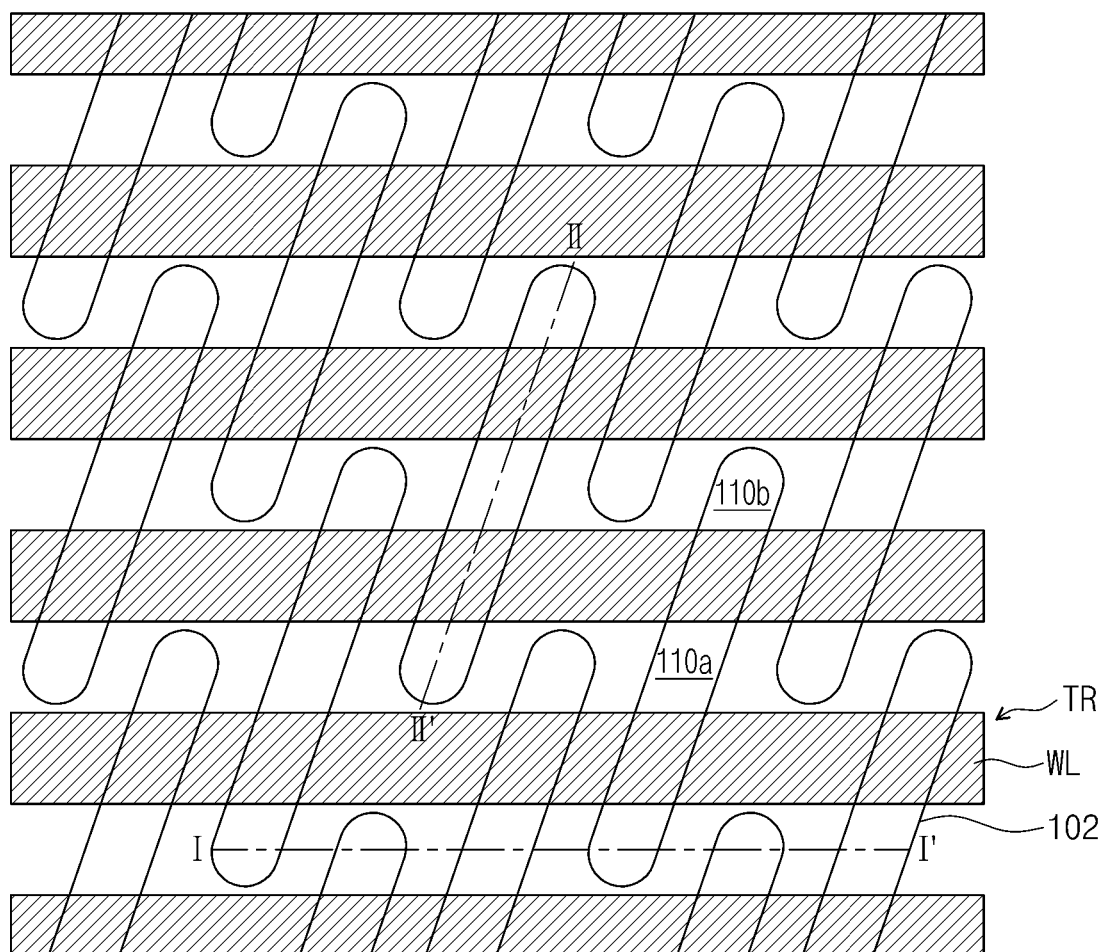
Figure 2B:
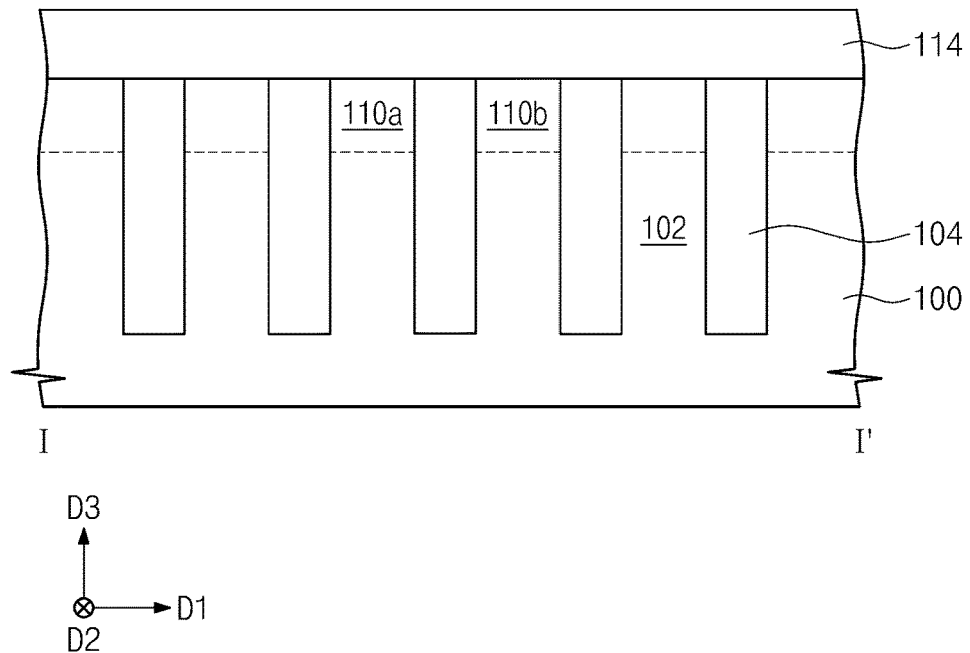
Figure 2C:
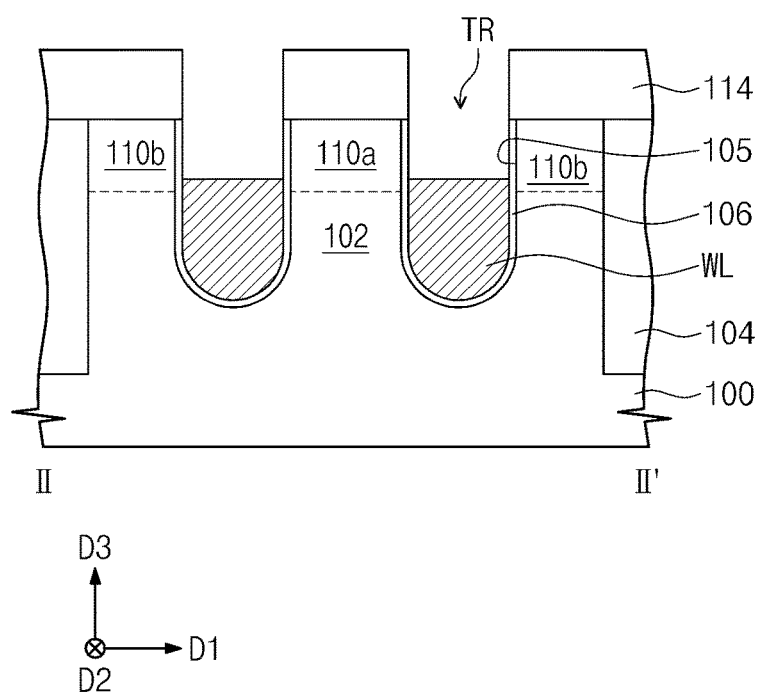

Referring to FIGS. 2A, 2B, and 2C, a device isolation layer 104 and transistors TR may be formed on a substrate 100. For example, trenches (not shown) may be formed in the substrate 100 to define active regions 102, and the device isolation layers 104 may be formed by filling the trenches with an insulating material. Here, the insulating material may include at least one of silicon oxide, silicon nitride, or silicon oxynitride.

A first mask layer 114 may be formed on the substrate 100, and the substrate 100 may be etched using the first mask layer 114 as a mask. As a result, recess regions 105 may be formed to cross the device isolation layer 104 and the active regions 102 or to be parallel to a first direction D1. The first mask layer 114 may be formed of or include at least one of silicon oxide, silicon nitride, or silicon oxynitride. A gate insulating layer 106 may be conformally formed on the substrate 100 provided with the recess regions 105. For example, a thermal oxidation process may be performed on a silicon surface of the substrate 100 to form a silicon oxide layer serving as the gate insulating layer 106. In certain embodiments, a deposition process may be performed to form the gate insulating layer 106 on the substrate 100 provided with the recess regions 105. In this case, the gate insulating layer 106 may be formed of or include at least one of silicon oxide, hafnium oxide, aluminum oxide, or zirconium oxide.

Word lines WL may be formed on the gate insulating layer 106. The word lines WL may be formed to fill lower portions of the recess regions 105, respectively. Each of the word lines WL may include at least one of doped polysilicon, metals (e.g., tungsten or copper), or metal compounds (e.g., titanium nitride). First and second impurity regions 110a and 110b may be formed by injecting impurities into the active region 102 at both sides of each of the word lines WL. The first and second impurity regions 110a and 110b, in conjunction with the gate insulating layer 106 and the word lines WL, may constitute the transistors TR.

Figure 3A:
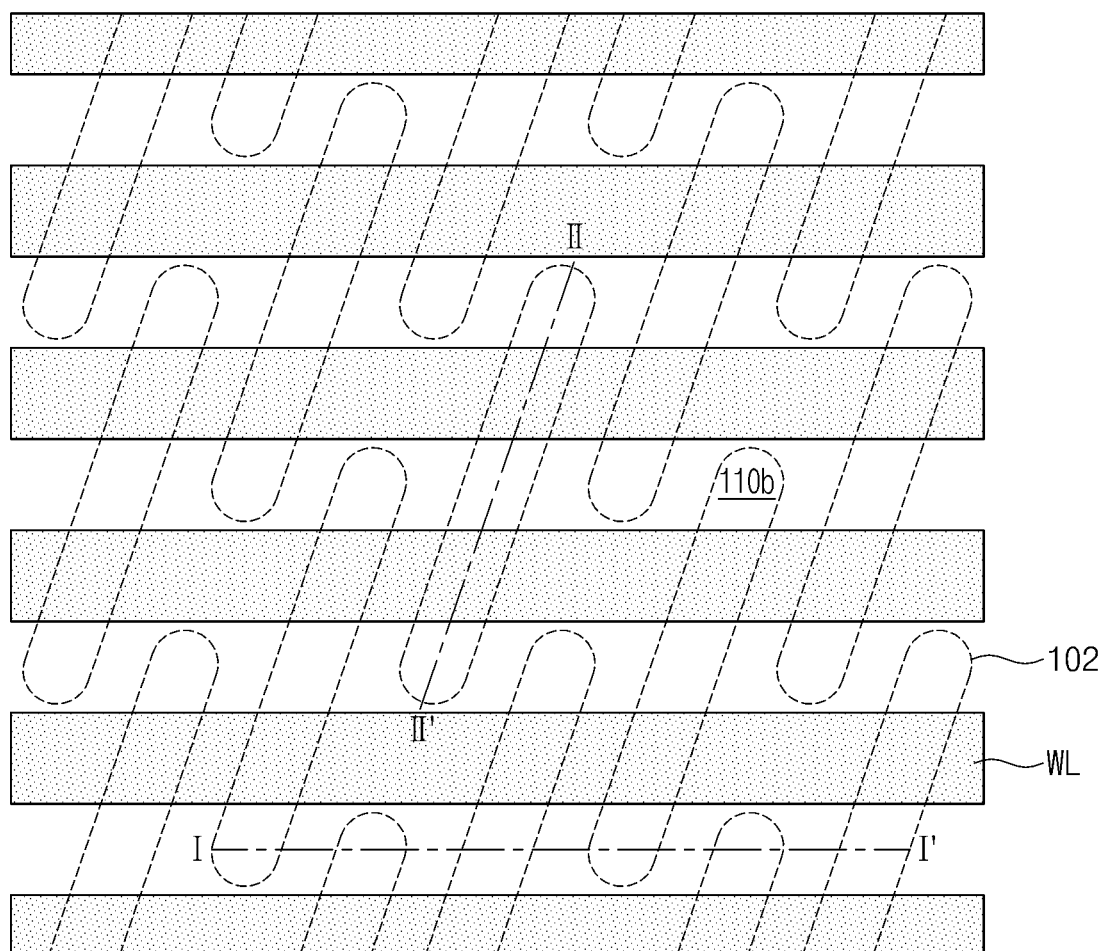
Figure 3B:
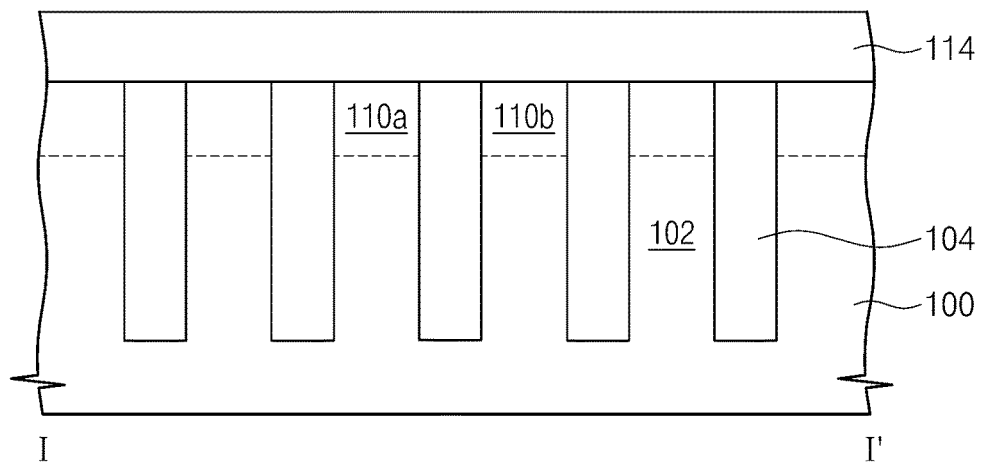
Figure 3C:
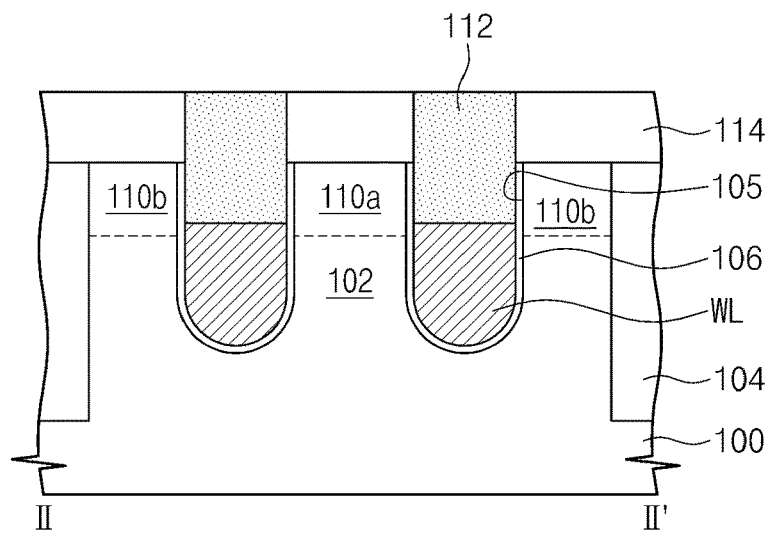

Referring to FIGS. 3A, 3B, and 3C, gate capping patterns 112 may be formed to fill upper portions of the recess regions 105 provided with the word lines WL.

For example, a capping insulating layer (not shown) may be formed on the substrate 100 to fill the upper portions of the recess regions 105. The capping insulating layer may be formed of or include at least one of silicon oxide, silicon nitride, or silicon oxynitride. Thereafter, the capping insulating layer may be etched to form the gate capping patterns 112 on the word lines WL, respectively. The gate capping patterns 112 may extend in the first direction D1. The gate capping patterns 112 may be formed to have top surfaces that are substantially coplanar with that of the first mask layer 114.

Figure 4A:
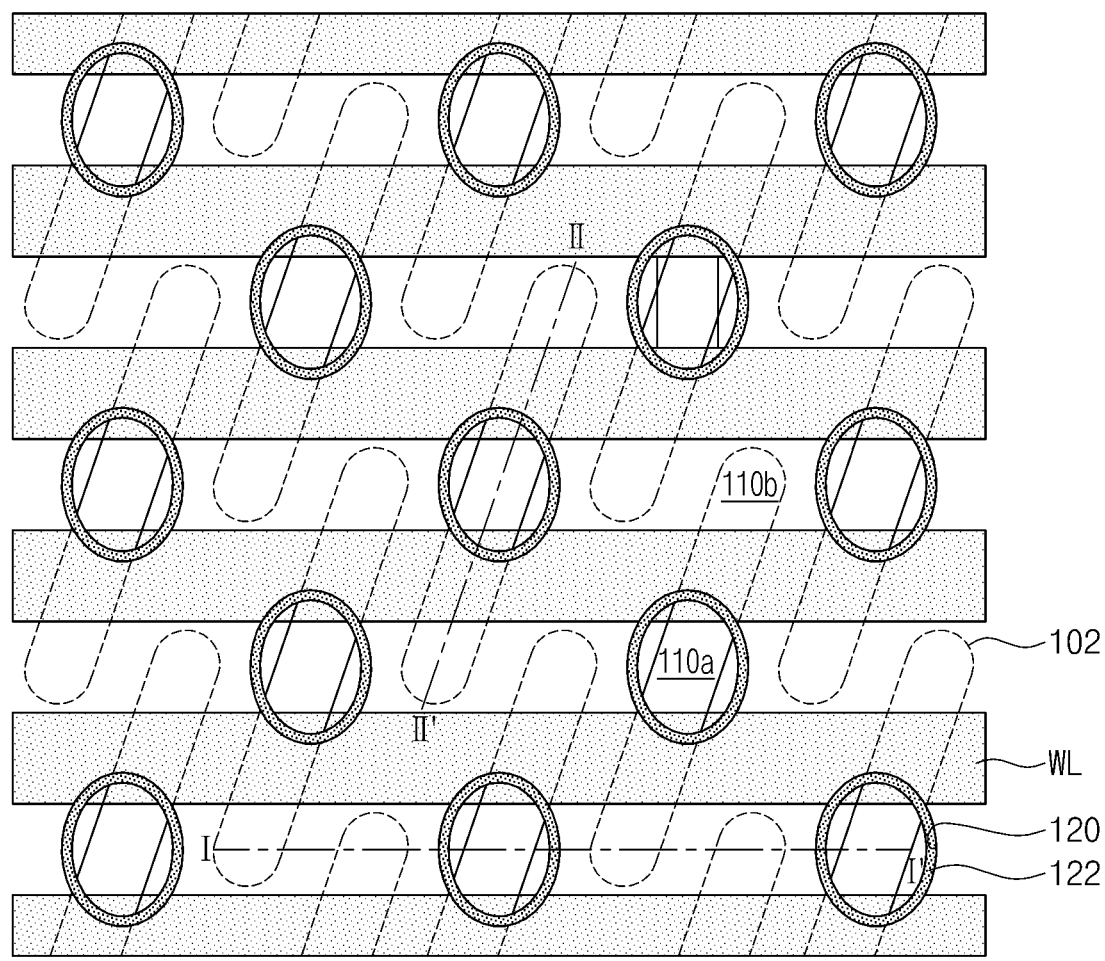
Figure 4A:
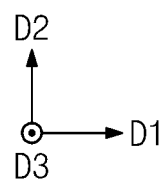
Figure 4B:
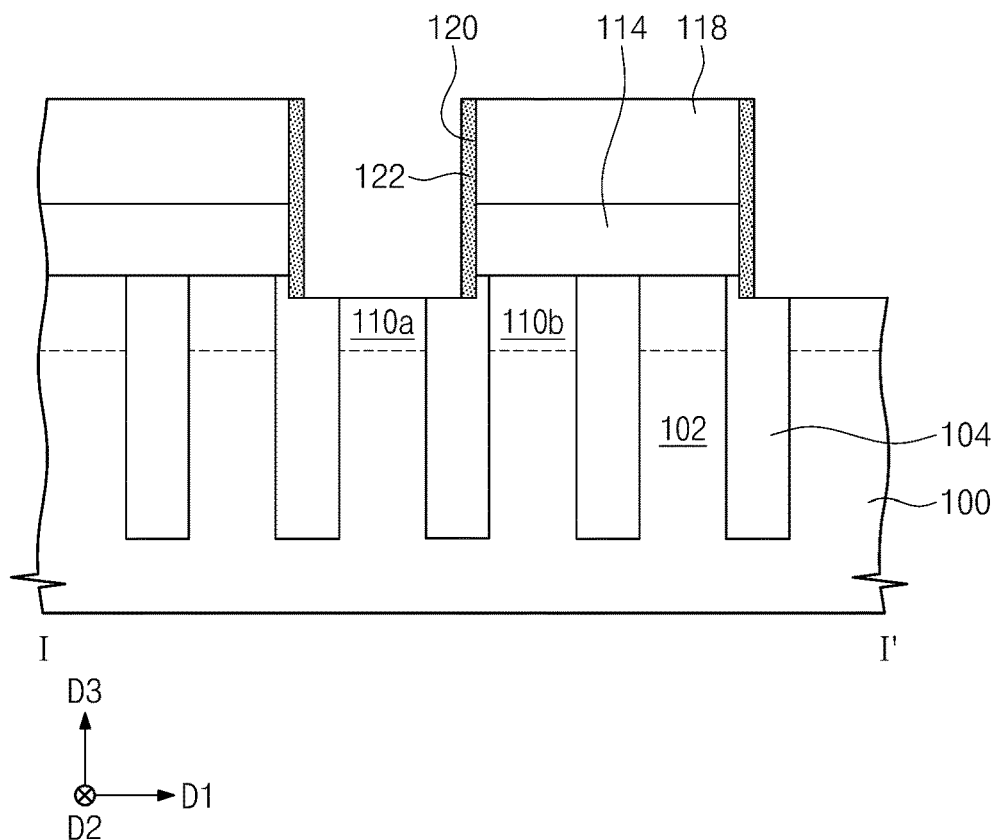
Figure 4C:
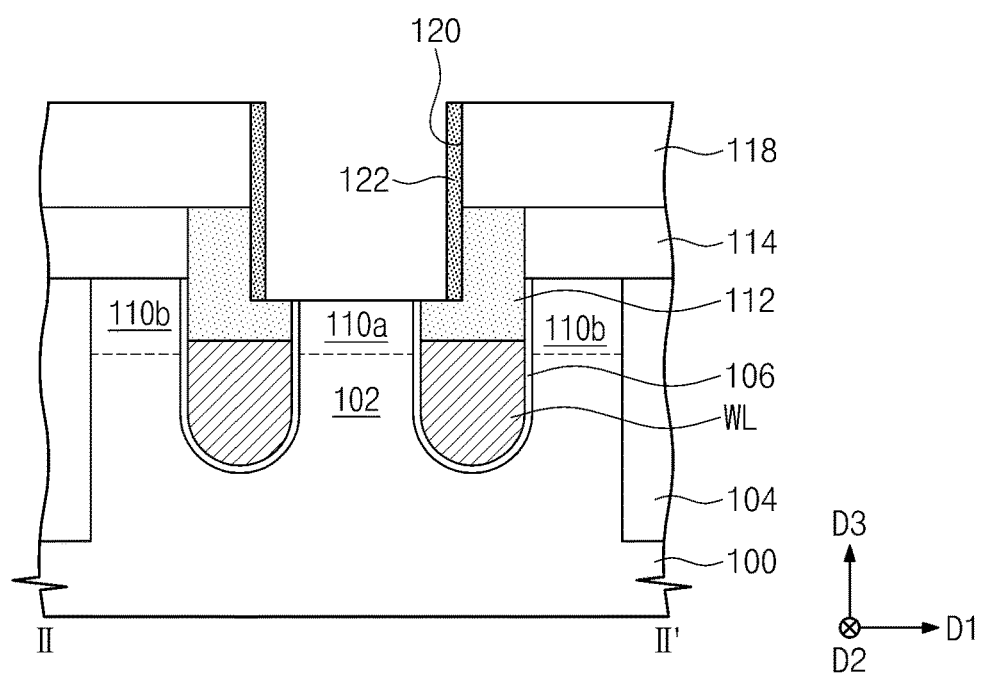

Referring to FIGS. 4A, 4B, and 4C, a first interlayered insulating layer 118 may be formed on the gate capping patterns 112 and the first mask layer 114, and first contact holes 120 may be formed to expose the first impurity regions 110a, respectively. The first interlayered insulating layer 118 may include a material having a high etch selectivity with respect to the capping insulating layer. For example, the first interlayered insulating layer 118 may be formed of or include at least one of silicon oxide, silicon nitride, or silicon oxynitride.

Contact spacers 122 may be formed on inner sidewalls of the first contact holes 120, respectively. In detail, a spacer insulating layer (not shown) may be conformally formed on the first interlayered insulating layer 118 with the first contact holes 120. The spacer insulating layer may include a material having a high etch selectivity with respect to the first interlayered insulating layer 118. The spacer insulating layer may be formed of or include at least one of silicon oxide, silicon nitride, or silicon oxynitride. The spacer insulating layer may be anisotropically etched to form the contact spacers 122 on the inner sidewalls of the first contact holes 120.

Figure 5A:
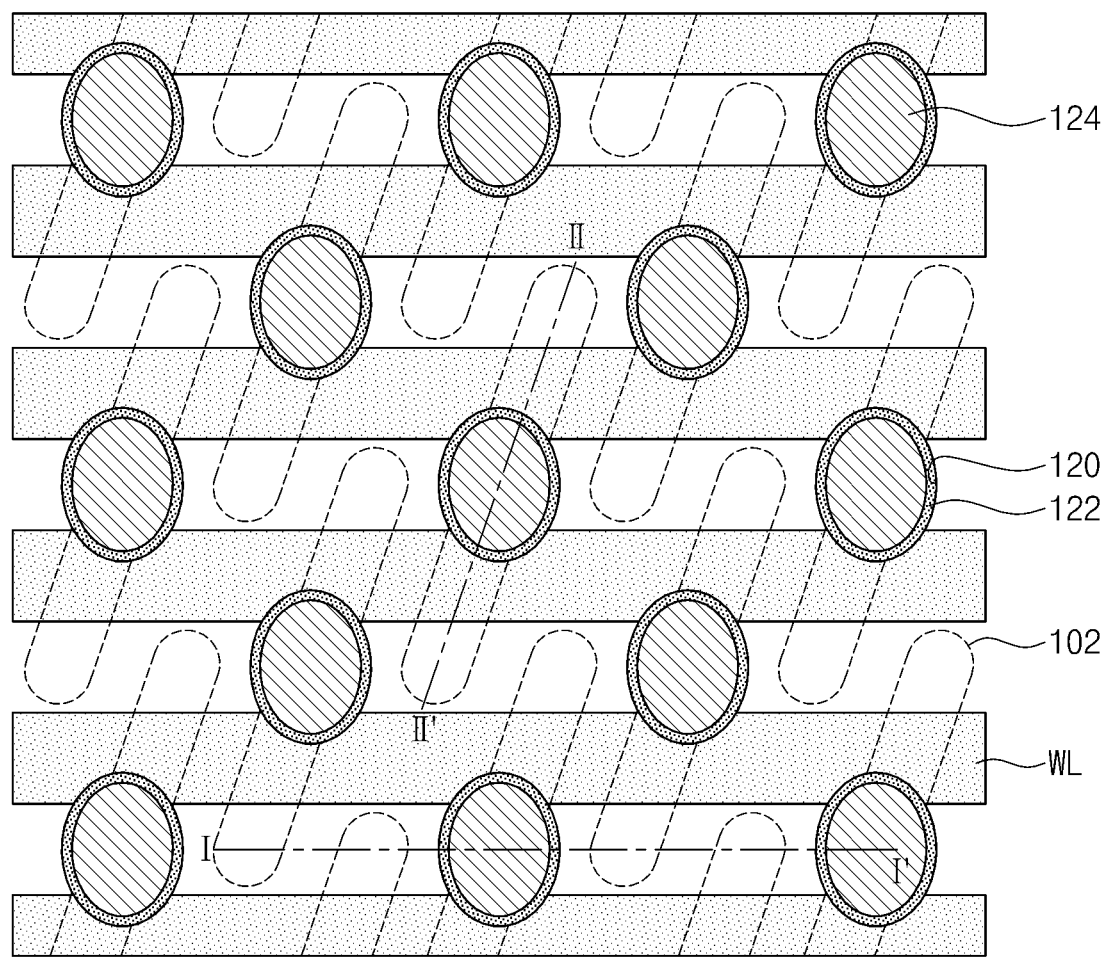
Figure 5B:
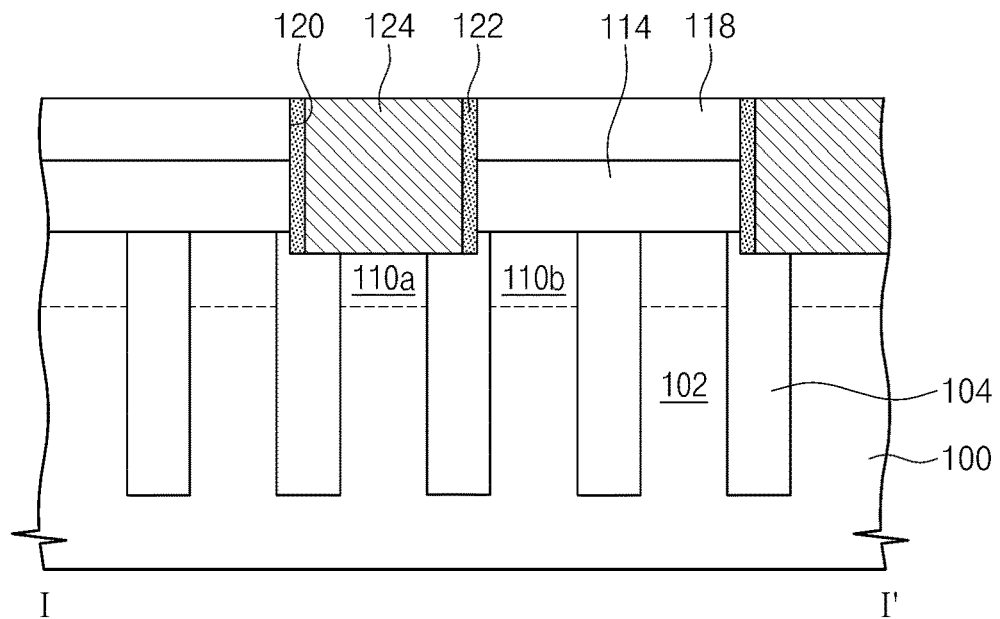
Figure 5C:
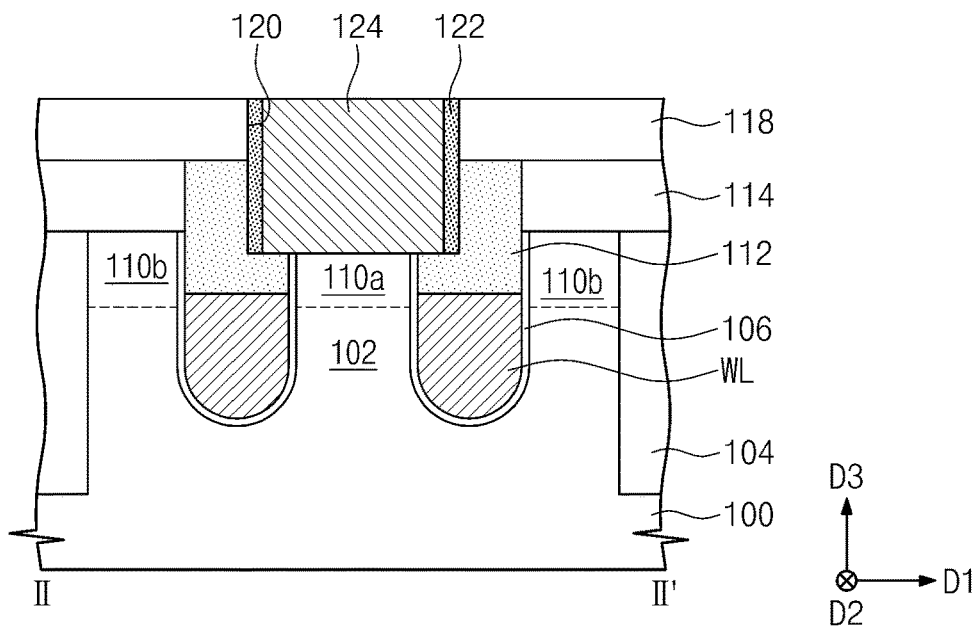

Referring to FIGS. 5A, 5B, and 5C, bit line contact plugs 124 may be formed by filling the first contact holes 120 with a conductive material. The conductive material may include at least one of doped polysilicon, metals (e.g., tungsten or copper), or metal compounds (e.g., titanium nitride).

Figure 6A:
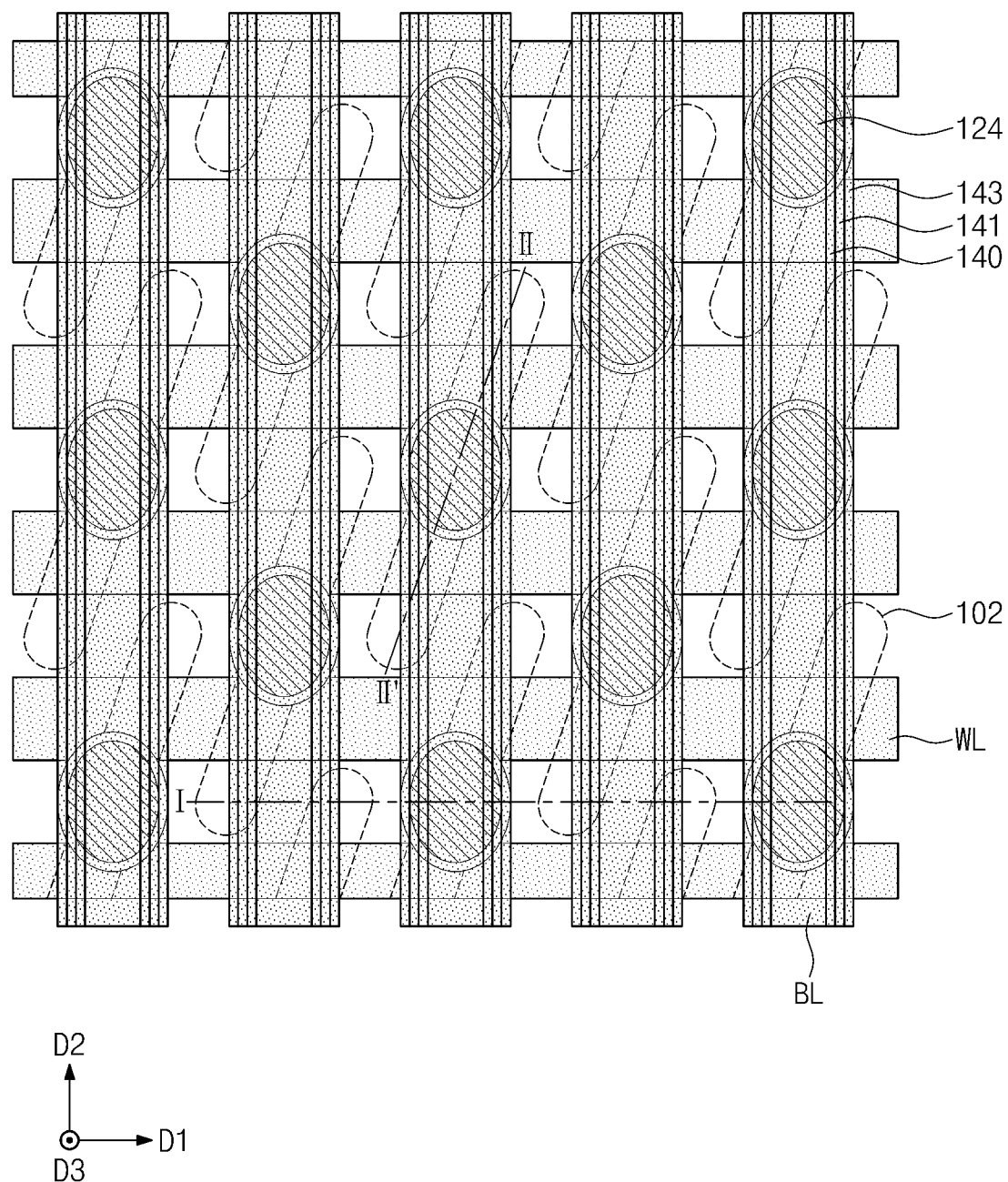
Figure 6B:
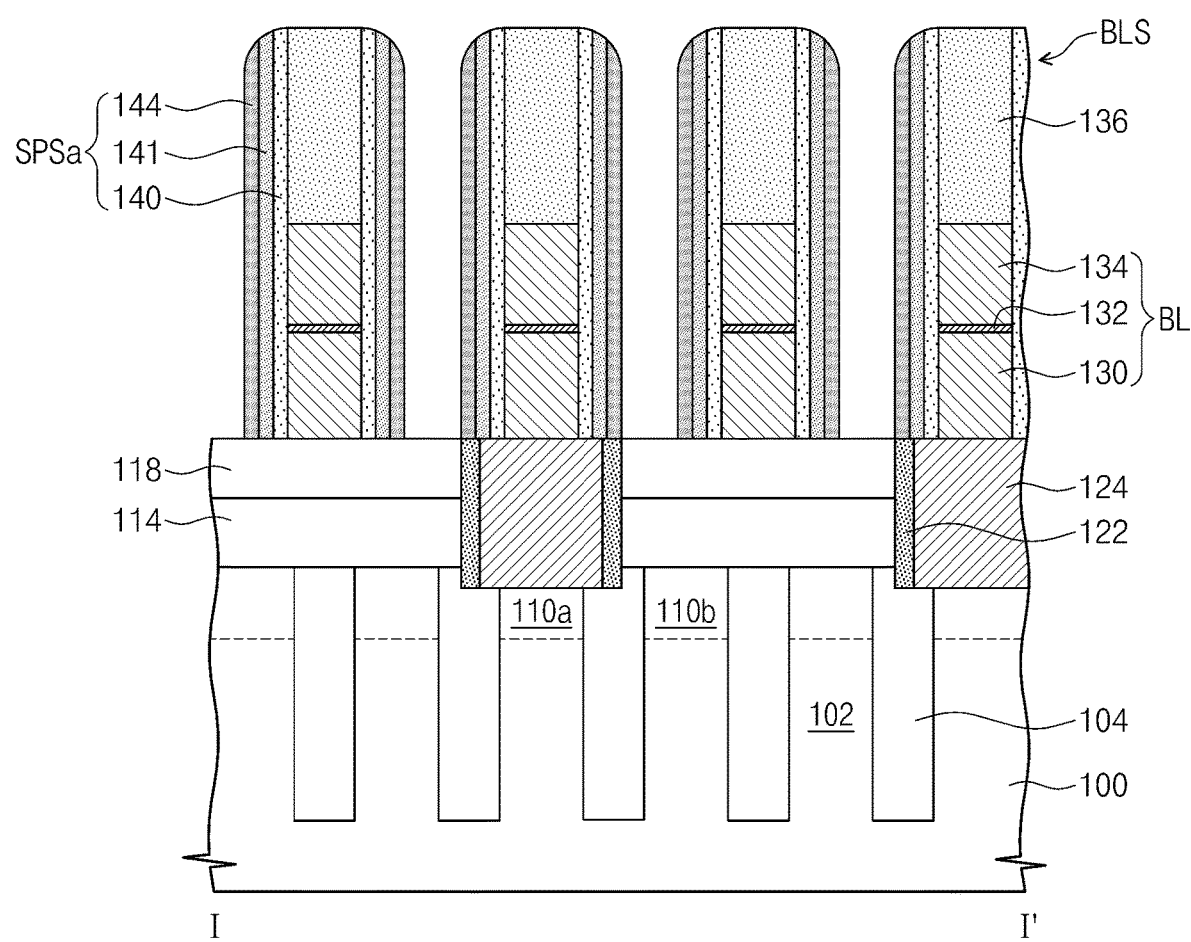
Figure 6C:
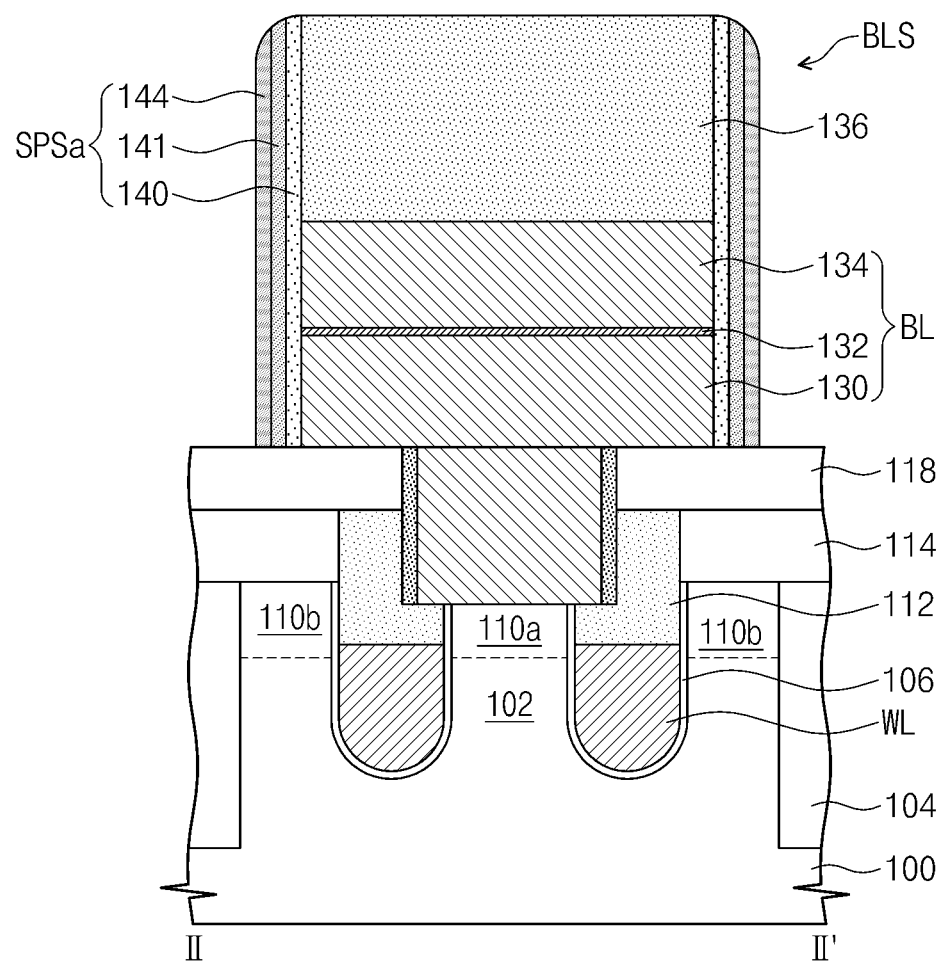

Referring to FIGS. 6A, 6B, and 6C, bit line structures BLS may be formed to be electrically connected to the bit line contact plugs 124, respectively, and preliminary spacer structures SPSa may be formed to protect the bit line structures BLS.

For example, a conductive layer (not shown) may be formed on the first interlayered insulating layer 118 to cover the bit line contact plugs 124. The conductive layer may have a multi-layered structure. For example, a first conductive layer (not shown), a second conductive layer (not shown), a third conductive layer (not shown), and a hard mask layer (not shown) may be sequentially formed on the first interlayered insulating layer 118. Thereafter, a hard mask layer (not shown) and first, second, third conductive layers may be sequentially patterned to form the bit line structures BLS, each of which includes a bit line BL and a hard mask pattern 136. Here, the bit lines BL may extend to parallel to each other and in a second direction D2, and each of them may include first, second, third conductive patterns 130, 132, and 134, which are sequentially stacked on the first interlayered insulating layer 118. In some embodiments, the first conductive layer may include doped polysilicon, the second conductive layer may include at least one of silicides (e.g., cobalt silicide or titanium silicide) or nitrides (e.g., aluminum titanium nitride), and the third conductive layer may include tungsten silicide or tungsten. The hard mask pattern 136 may include at least one of silicon nitride or silicon oxynitride.

Thereafter, the preliminary spacer structures SPSa may be formed on both sidewalls of each of the bit line structures BL. First, second, third insulating layers may be sequentially and conformally formed on both sidewalls of the bit line structures BLS. The first insulating layer may include a material having a high etch selectivity with respect to the first interlayered insulating layer 118. The second insulating layer may include a material having a high etch selectivity with respect to the first insulating layer. The third insulating layer may include a material having a high etch selectivity with respect to the second insulating layer. For example, the first and third insulating layers may include at least one of silicon nitride or silicon oxynitride, and the second insulating layer may include silicon oxide. The first, second, third insulating layers may be anisotropically etched to form the preliminary spacer structures SPSa, each of which includes a first spacer 140 (corresponding to the first insulating layer), a sacrificial spacer 141 (corresponding to the second insulating layer), and a second spacer 144 (corresponding to the third insulating layer).

Although not shown, a mold layer (not shown) may be formed between each adjacent pair of the bit line structures BLS. The mold layer (not shown) may be formed along the second direction D2. The mold layer may fill in spaces between facing preliminary spacer structures SPSa of adjacent bit line structures BLS. The mold layer (not shown)

may be formed of or include at least one of silicon oxide, silicon nitride, or silicon oxynitride.

Figure 7A:
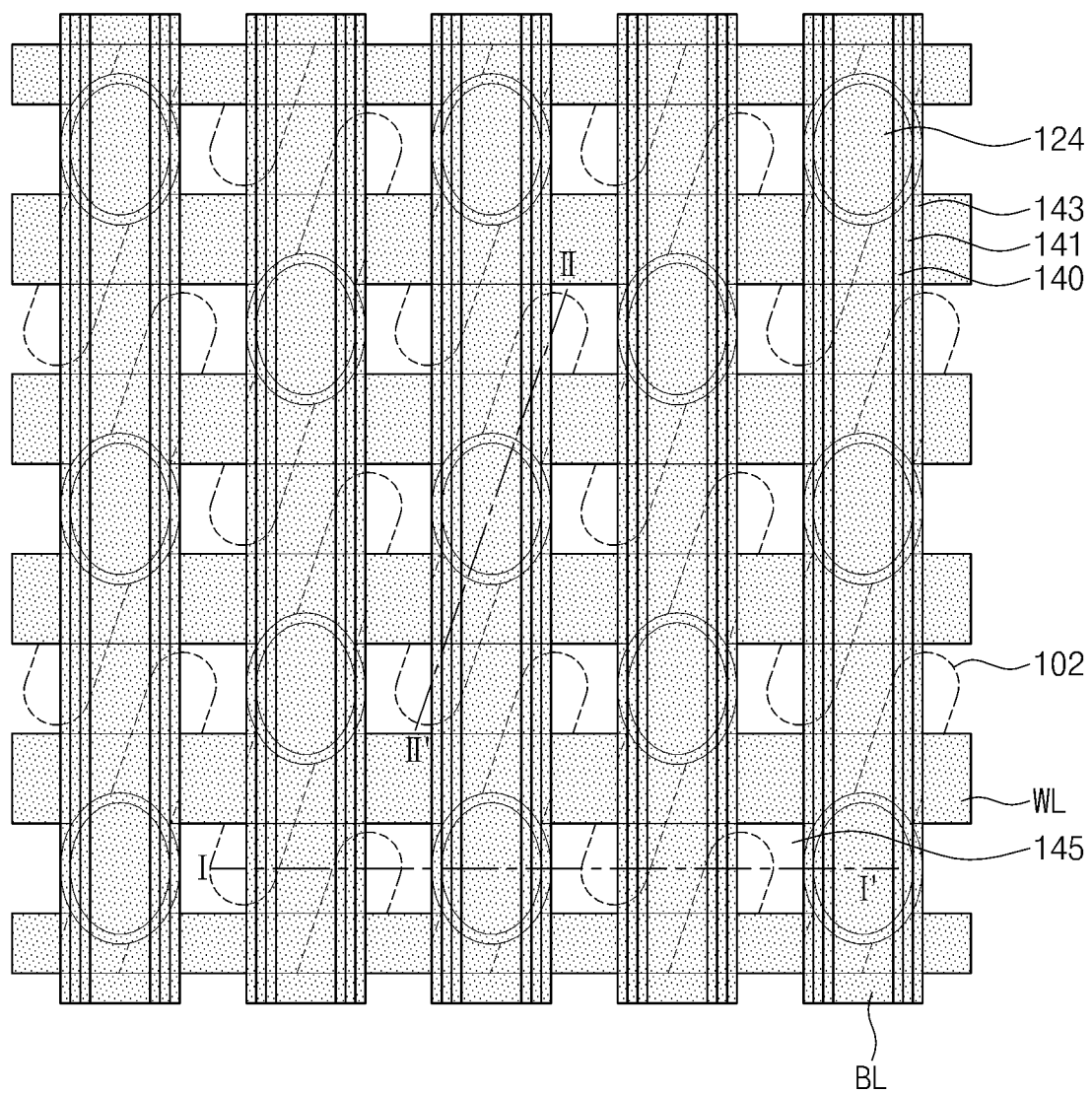
Figure 7B:
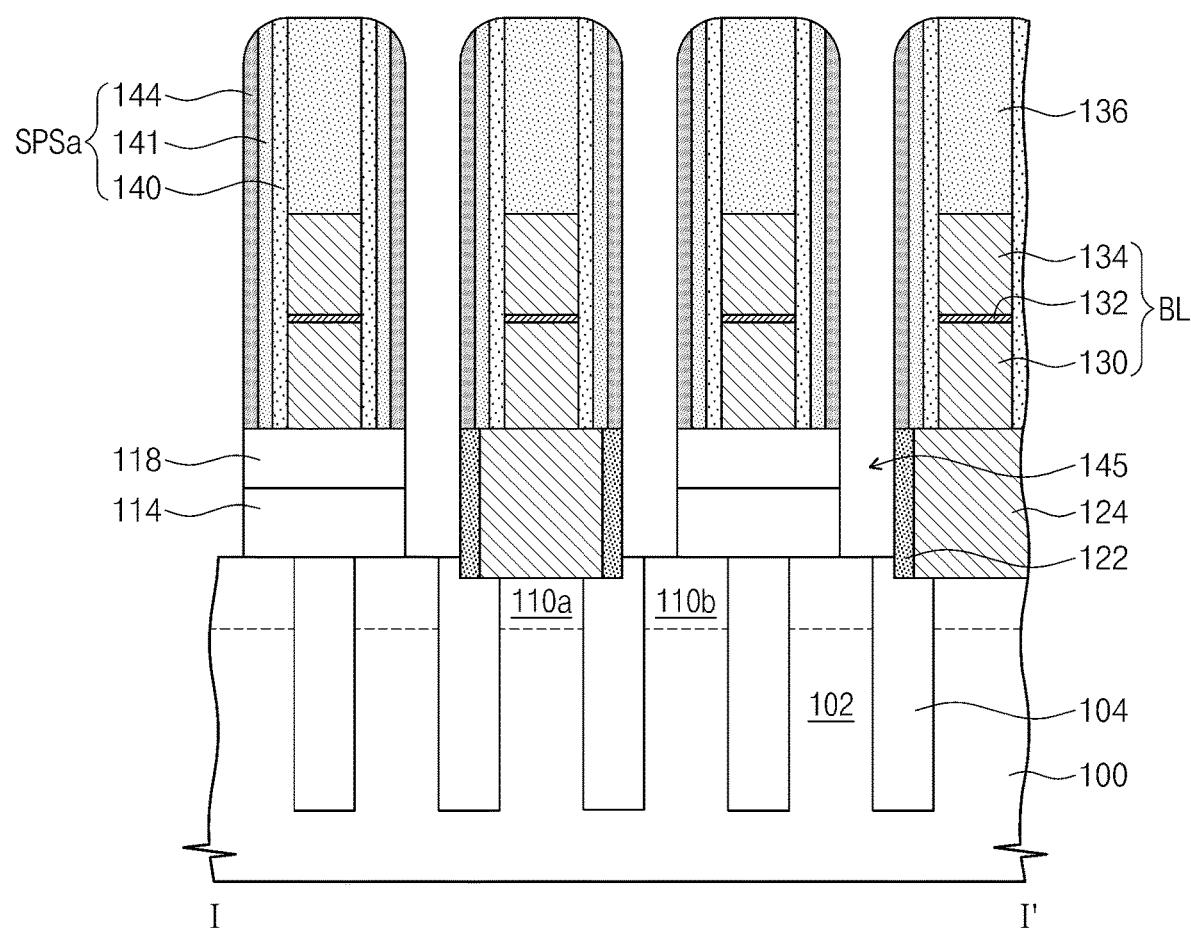
Figure 7C:
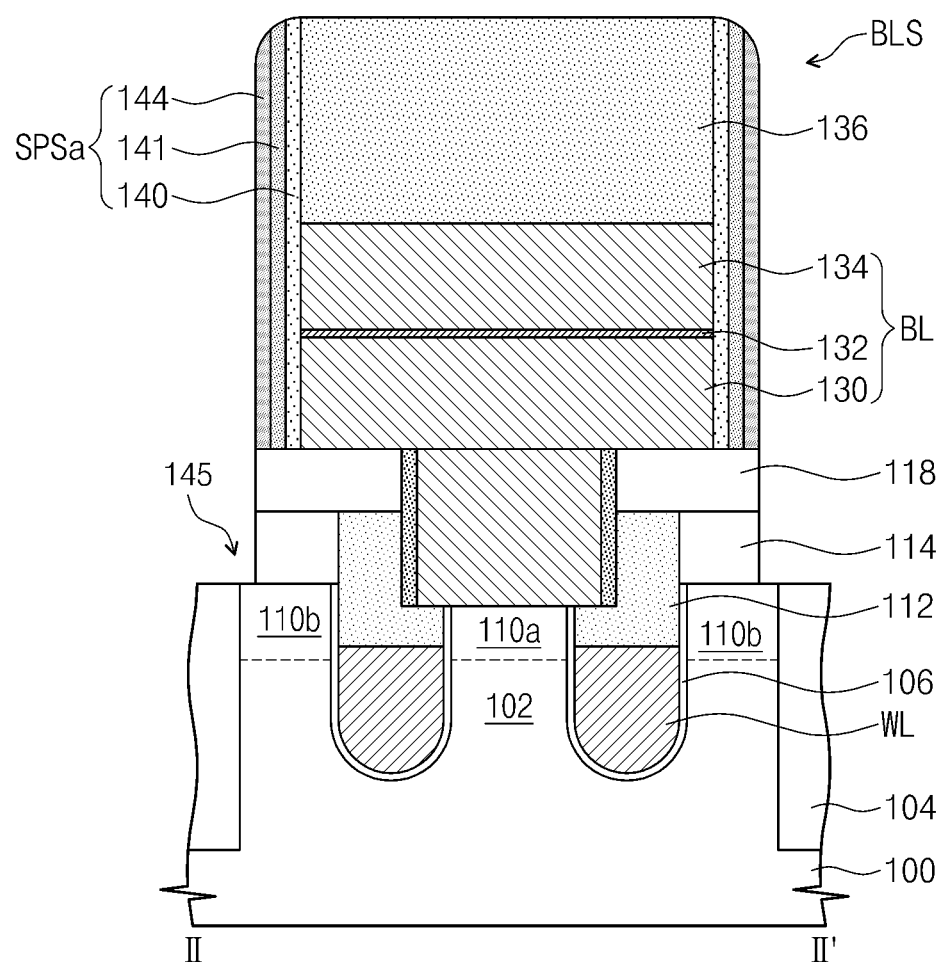

Referring to FIGS. 7A and 7B, preliminary contact holes 145 may be formed to partially expose the second impurity regions 110*b*. The mold layer (not shown), the first mask layer 114, and the first interlayered insulating layer 118 between adjacent ones of the word lines WL may be etched to form the preliminary contact holes 145 and a mold pattern 138 (e.g., of FIG. 1A). The mold pattern 138 (e.g., of FIG. 1A) may remain on the gate capping pattern 112. In the process of forming the preliminary contact holes 145, the bit line structures BLS, the preliminary spacer structures SPSa, and the gate capping patterns 112 may be used as a mask pattern. The preliminary contact holes 145 may be formed to at least partially expose the second impurity regions 110*b*, respectively. Also, the contact spacer 122 may be partially etched during the process of forming the preliminary contact holes 145. In some embodiments, the preliminary contact holes 145 may be formed to have substantially the same width at bottom and top levels thereof.

Figure 8A:
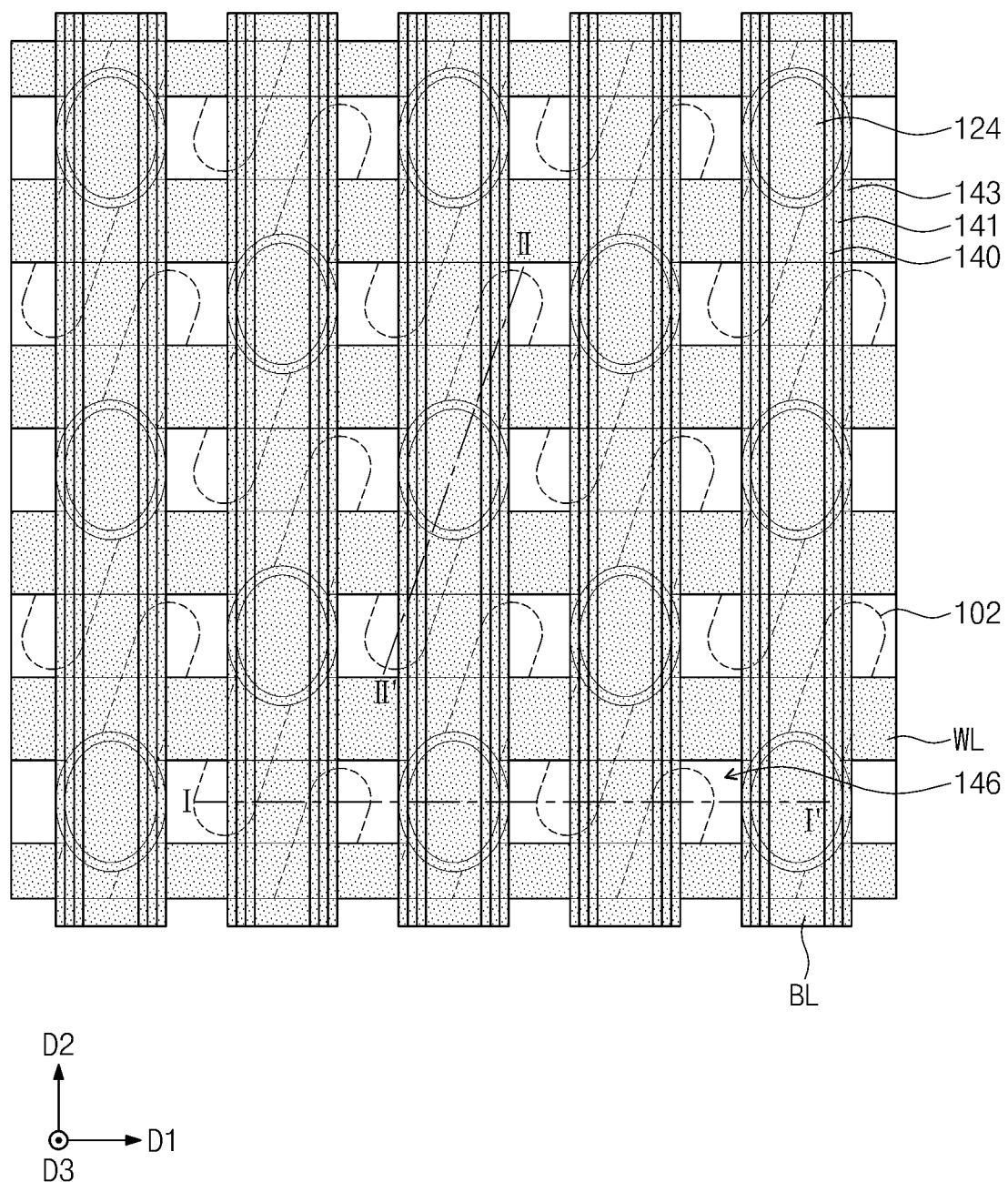
Figure 8B:
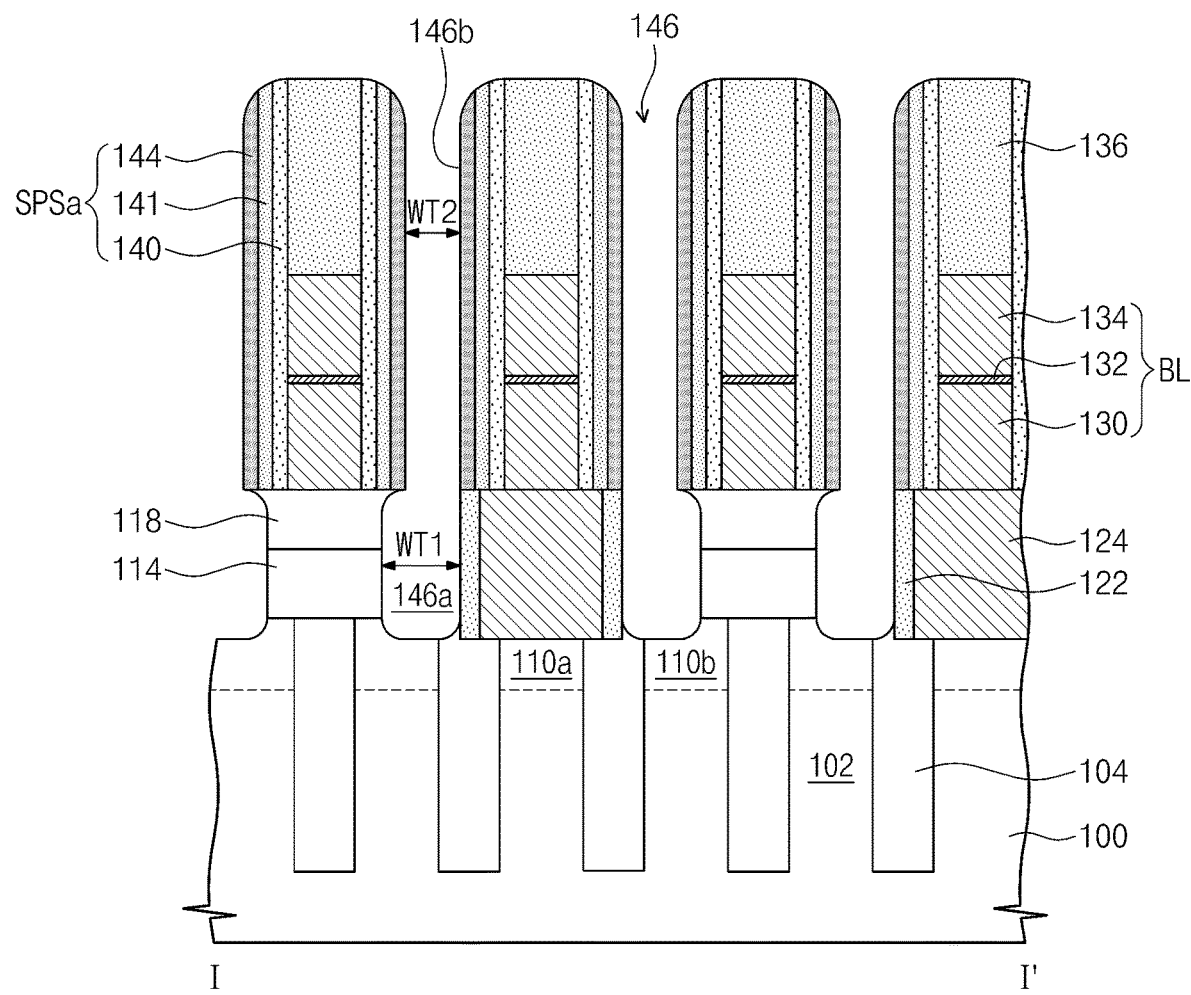
Figure 8C:
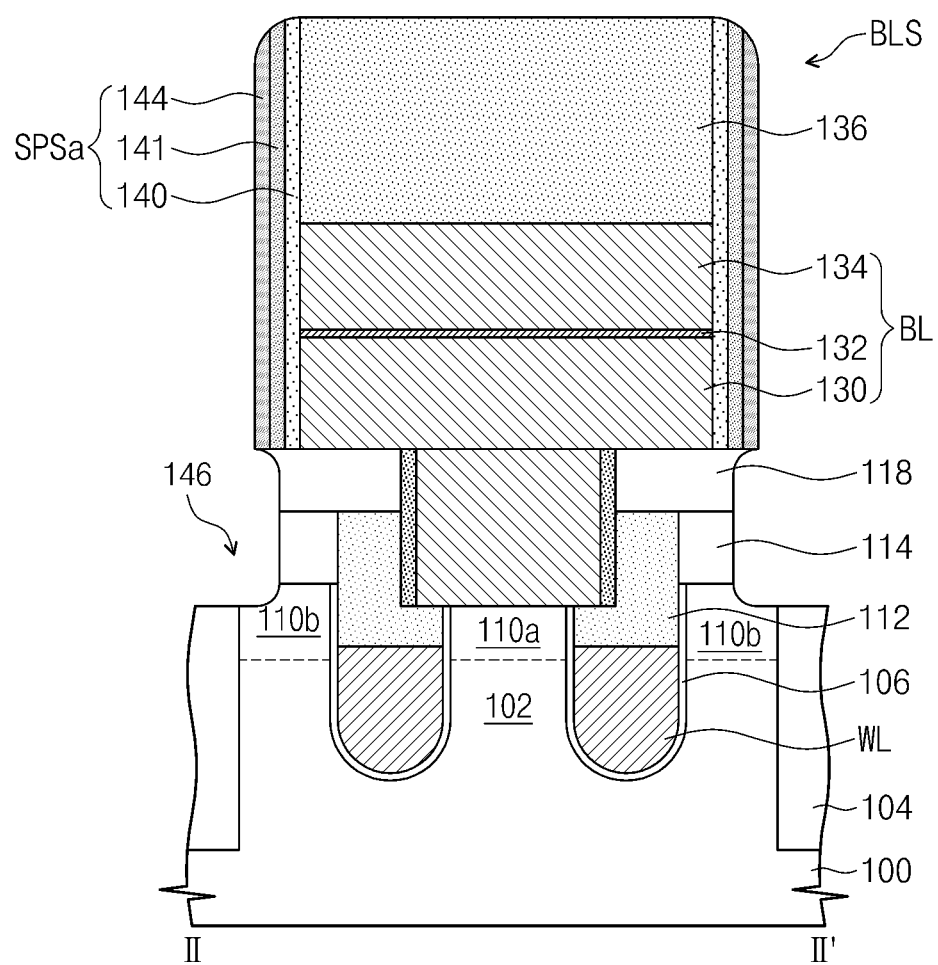

Referring to FIGS. 8A-8C, the first mask layer 114 and the first interlayered insulating layer 118 may be further etched to expand lower portions of the preliminary contact holes 145, and as a result, second contact holes 146 may be formed.

For example, the first interlayered insulating layer 118 may be isotropically etched through the preliminary contact holes 145 to expand the lower portions of the preliminary contact holes 145. Each of the second contact holes 146 may include a lower portion 146*a* of a first width WT1 and an upper portion 146*b* of a second width WT2, and here, the second width WT2 may be smaller than the first width WT1. As a result of the isotropic etching, the lower portion 146*a* of the second contact hole 146 may be shaped at least in part like a ball. For example, it may have at least some curved walls. The upper portion 146*b* of the second contact hole 146 may have substantially straight walls.

Figure 9A:
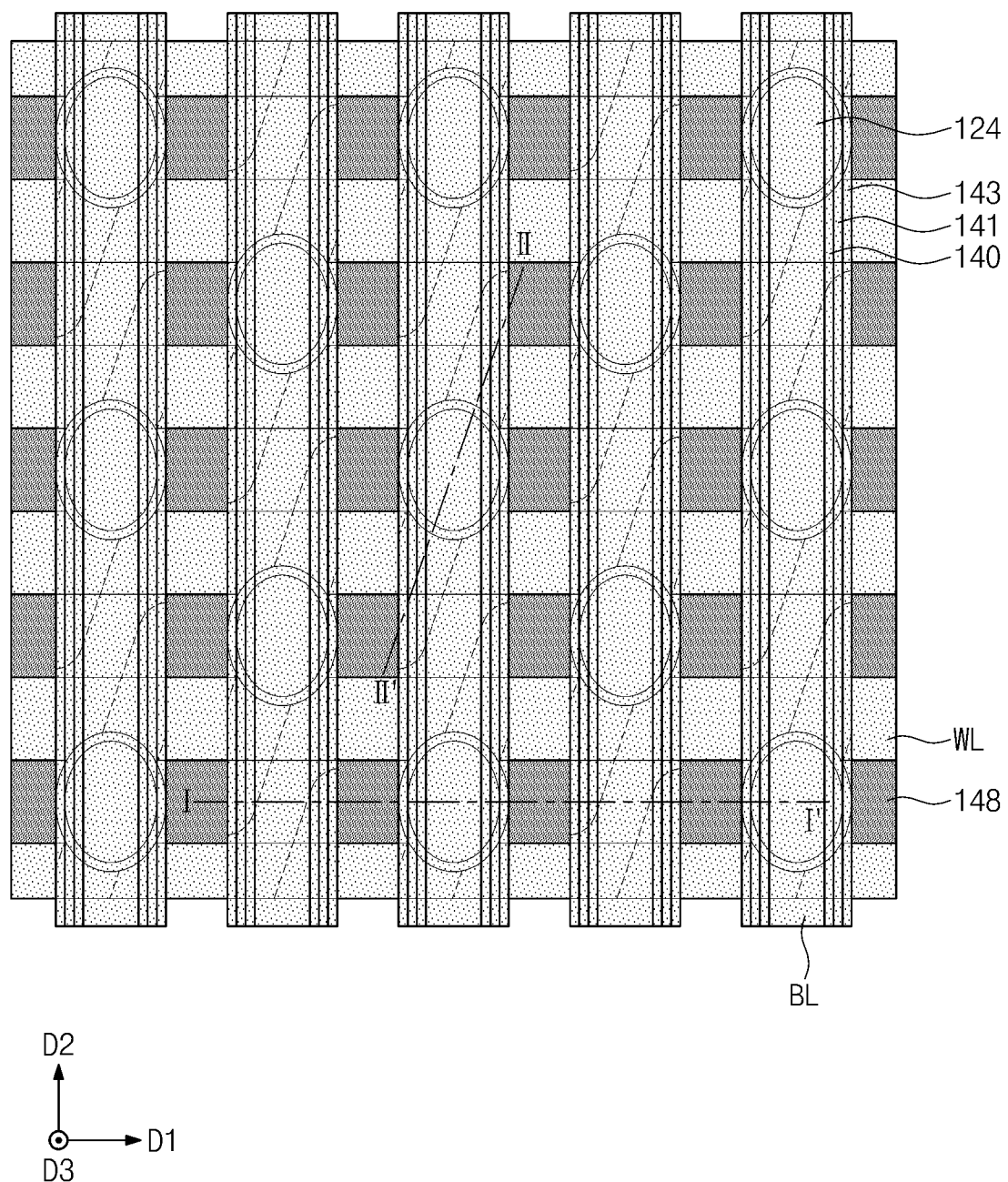
Figure 9B:
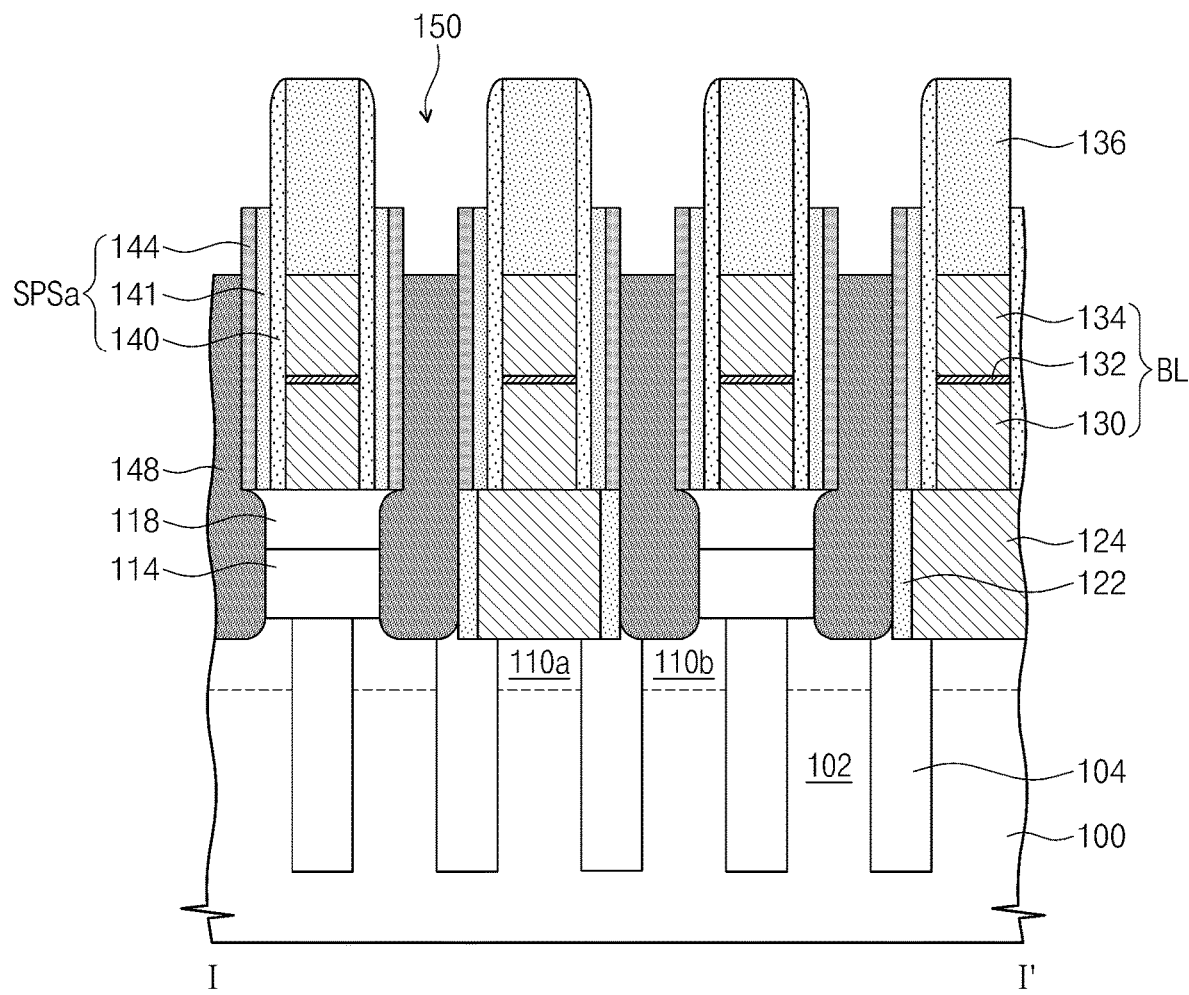
Figure 9C:
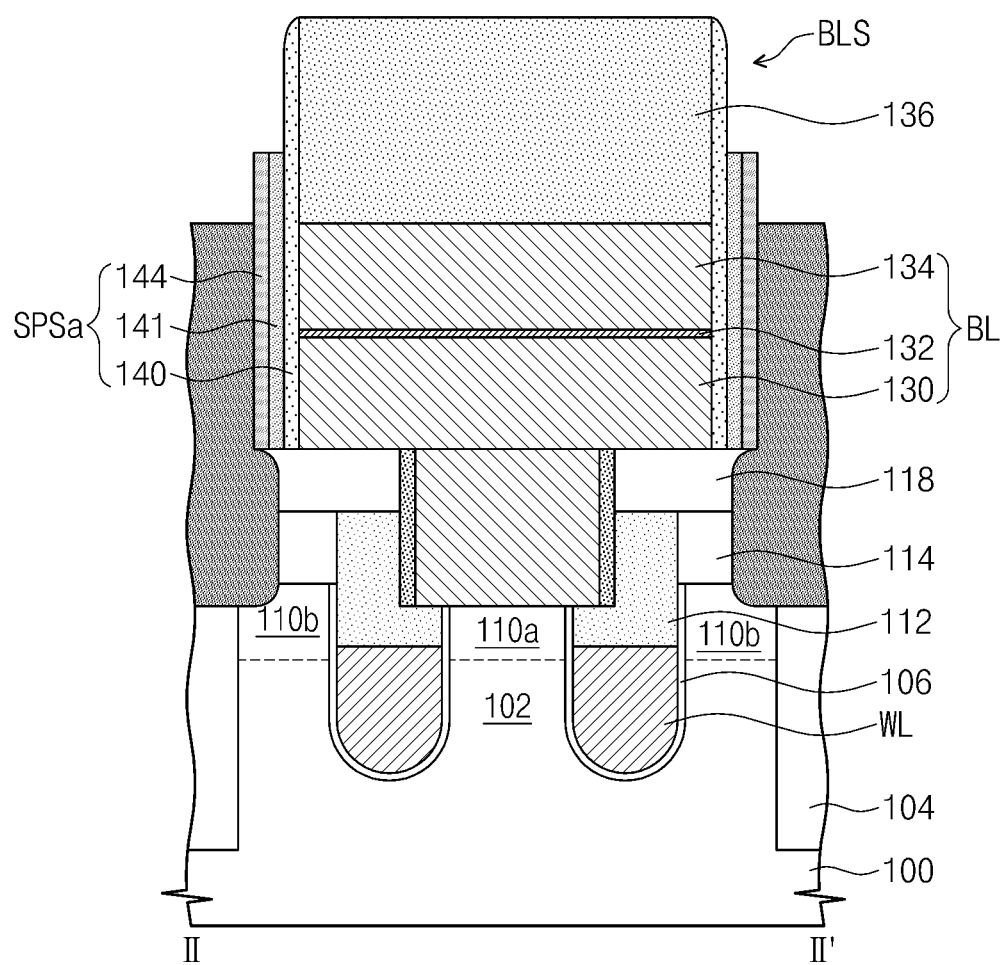

Referring to FIGS. 9A-9C, contact plugs 148 may be formed to fill the second contact holes 146, respectively, and the preliminary spacer structure SPSa may be partially recessed.

In more detail, a conductive contact layer (not shown) may be formed to fill the second contact holes 146. The conductive contact layer may include at least one of doped polysilicon, metals (e.g., tungsten or copper), or metal compounds (e.g., titanium nitride). Thereafter, the conductive contact layer may be etched to expose the bit line structures BLS and upper portions of the preliminary spacer structures SPSa, and as a result, the contact plugs 148 may be formed in the second contact holes 146, respectively. In each of the second contact holes 146, the lower portion 146*a* may be wider than the upper portion 146*b* (i.e., WT1>WT2), and thus, a void (not shown) may be formed in the lower portion of each of the second contact holes 146, when the conductive contact layer is formed in the second contact holes 146. Third contact holes 150, which are defined by the preliminary spacer structure SPSa and the hard mask pattern 136, may be formed on the contact plugs 148. Each of the third contact holes 150 may be formed to have a lower width smaller than its upper width, thereby having a 'T'-shaped vertical section.

In more detail, the upper portion of the preliminary spacer structure SPSa may be etched. For example, upper portions of the sacrificial and second air spacers 141 and 144 may be etched. The sacrificial spacers 141 and the second air spacers 144 may be etched to have a height greater than that of the contact plugs 148. By etching the upper portions of the sacrificial and second air spacers 141 and 144 of the preliminary spacer structure SPSa, it is possible to increase a contact margin between the bit line structures BLS and the landing pads 154 to be formed in a subsequent process.

Figure 10A:
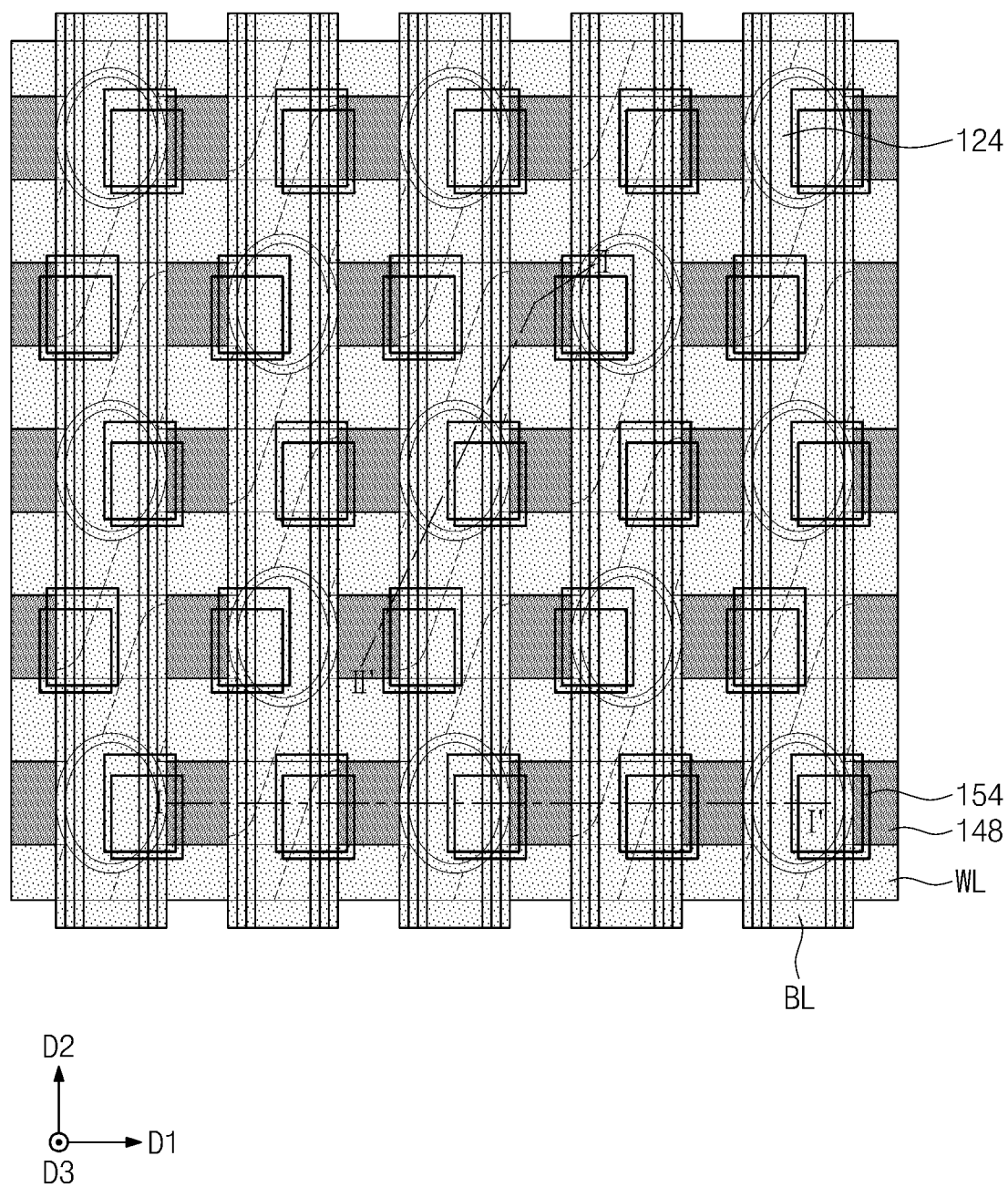
Figure 10B:
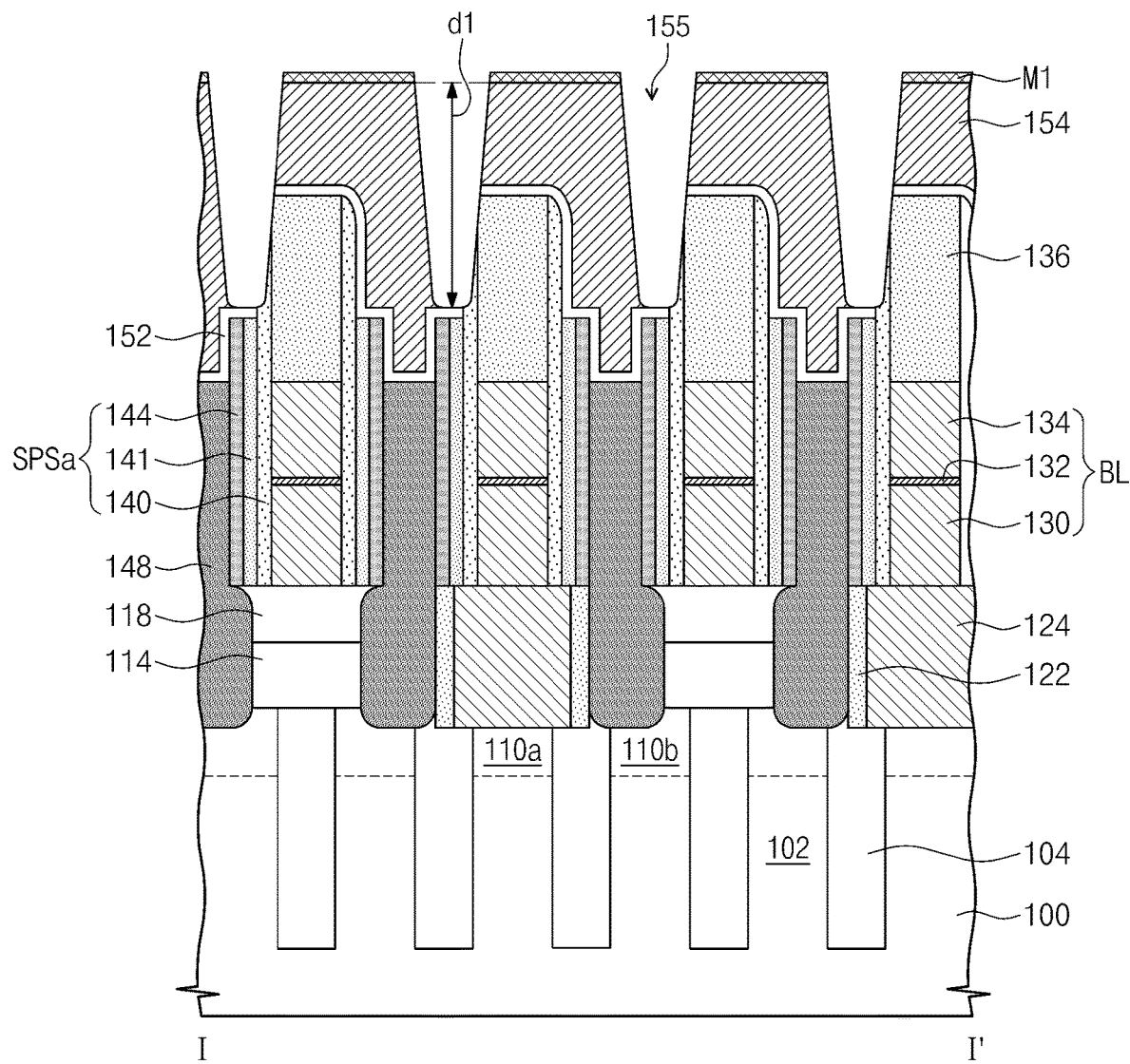
Figure 10C:
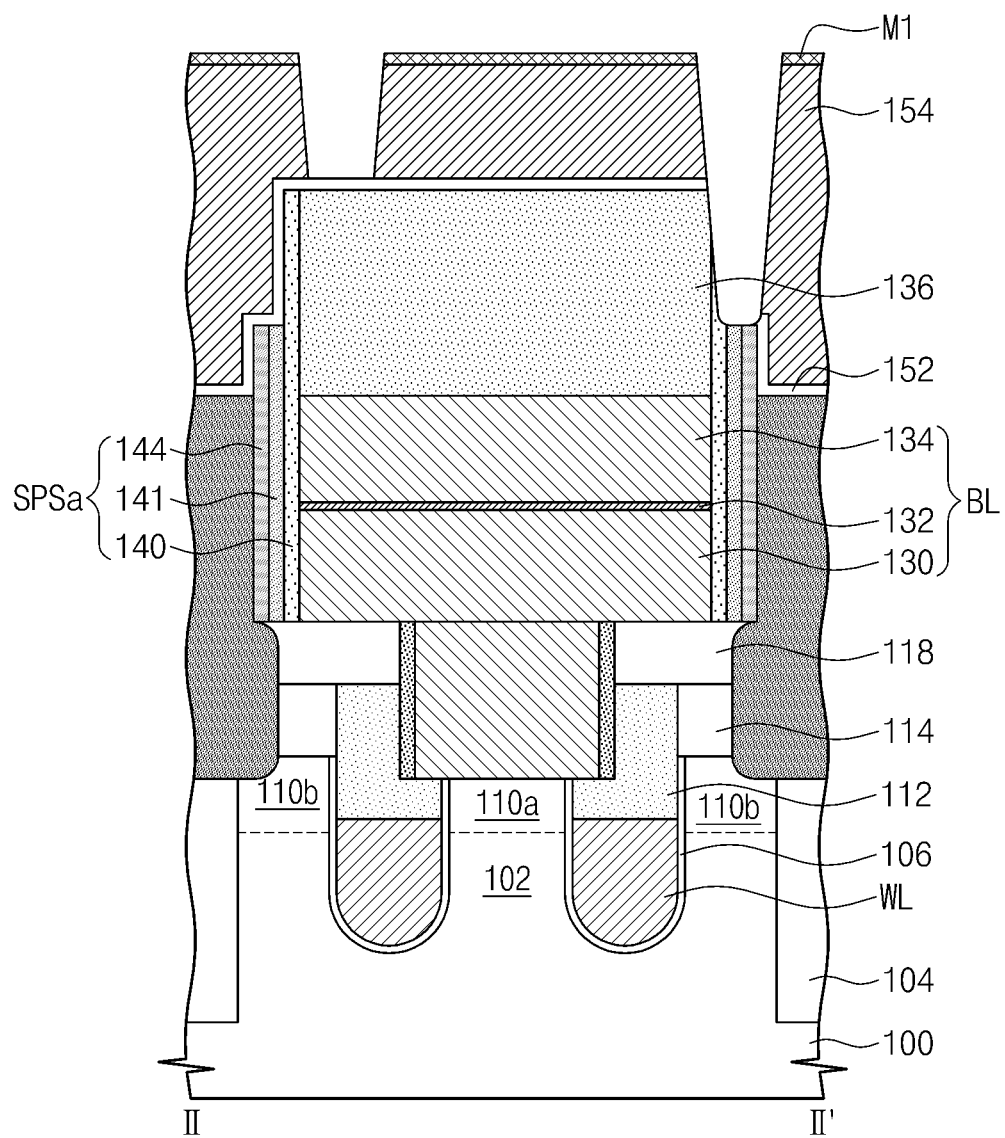

Referring to FIGS. 10A, 10B, and 10C, the landing pads 154 may be formed on the contact plugs 148, the preliminary spacer structures SPSa, and the bit line structures BLS.

In detail, a barrier layer 152 may be conformally formed on the contact plugs 148, the preliminary spacer structures SPSa, and the bit line structures BLS. The barrier layer 152 may be formed of or include, for example, titanium nitride.

Next, a fourth conductive layer (not shown) may be formed on the barrier layer 152 to fill the third contact holes 150. A mask pattern M1 may be formed on the fourth conductive layer to define shapes and positions of the landing pads 154. The fourth conductive layer may be formed of or include at least one of metals (e.g., tungsten or copper). For the sake of simplicity, the description that follows will refer to an example in which the fourth conductive layer includes tungsten. The landing pads 154 may be formed by etching the fourth conductive layer, which is exposed by the mask pattern M1, using the mask pattern M1 as an etch mask. In certain embodiments, the hard mask patterns 136 and first spacers 140 may be partially etched between the mask pattern M1, when the fourth conductive layer is etched. As a result of the etching, an opening 155 having a first depth d1 may be formed, and the landing pads 154 may be defined by the opening 155. The landing pads 154 may be formed to have bottom surfaces, which are higher than the top surface of the barrier layer 152 or is in contact with the barrier layer 152.

Figure 11A:
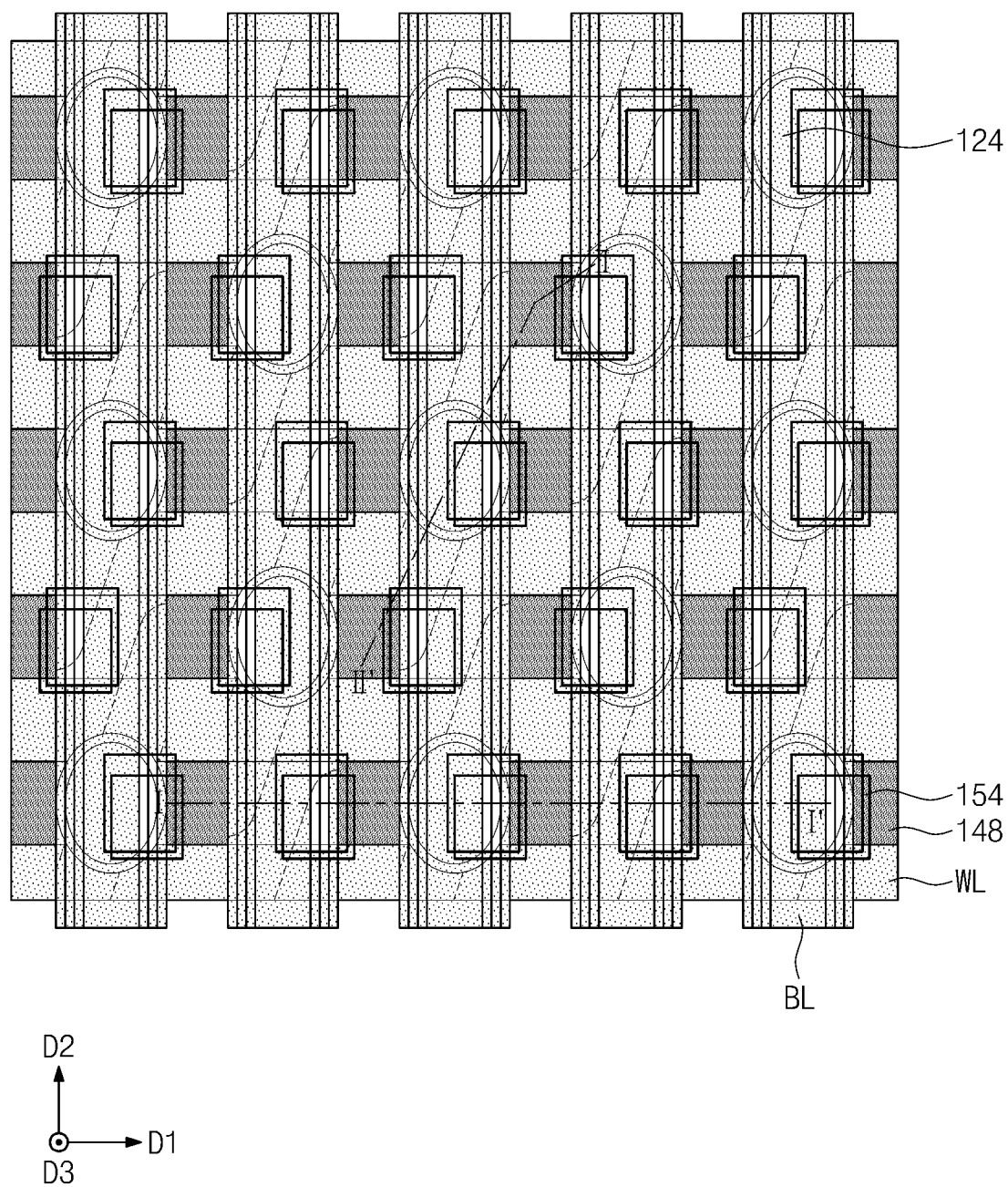
Figure 11B:
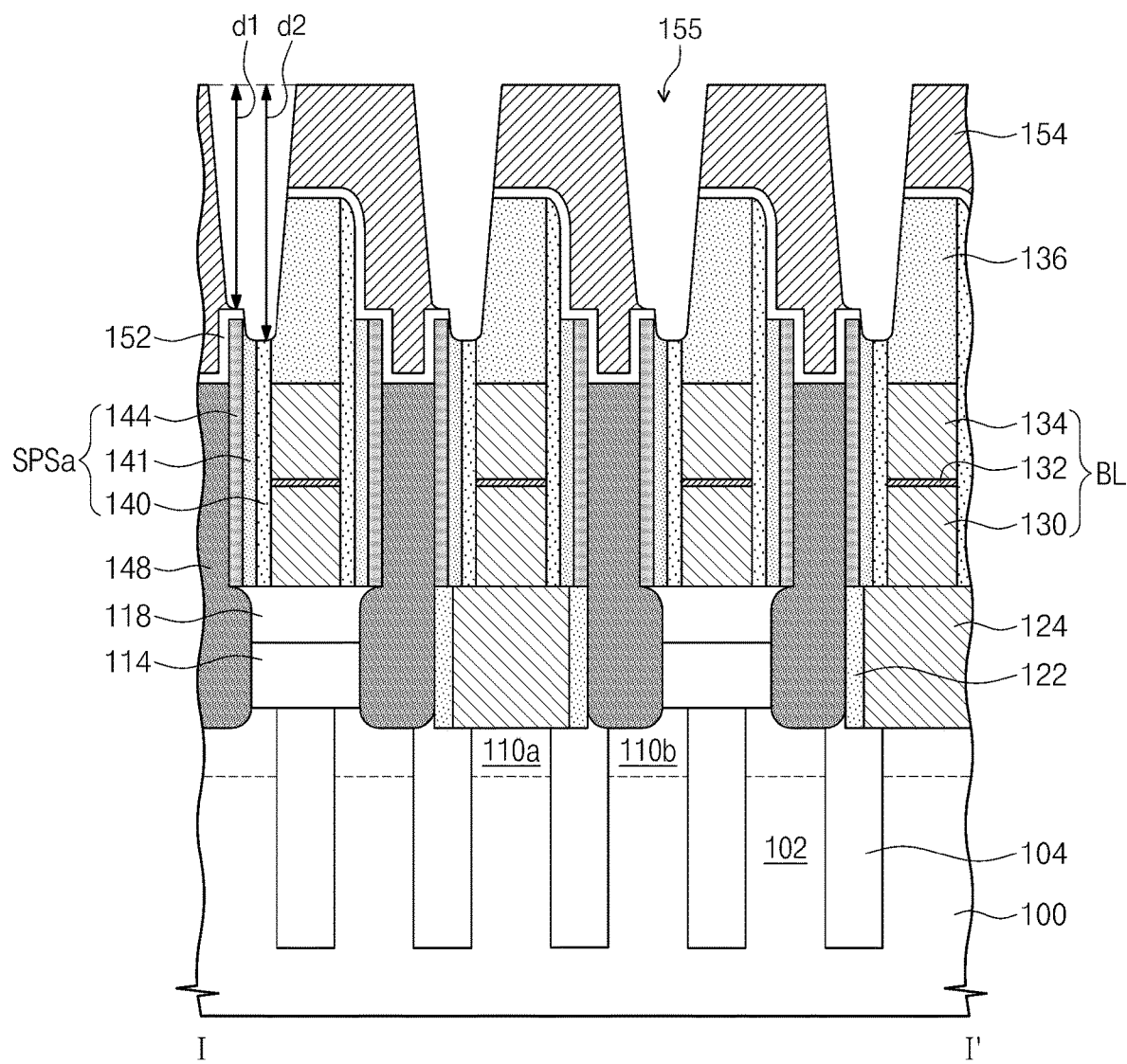
Figure 11C:
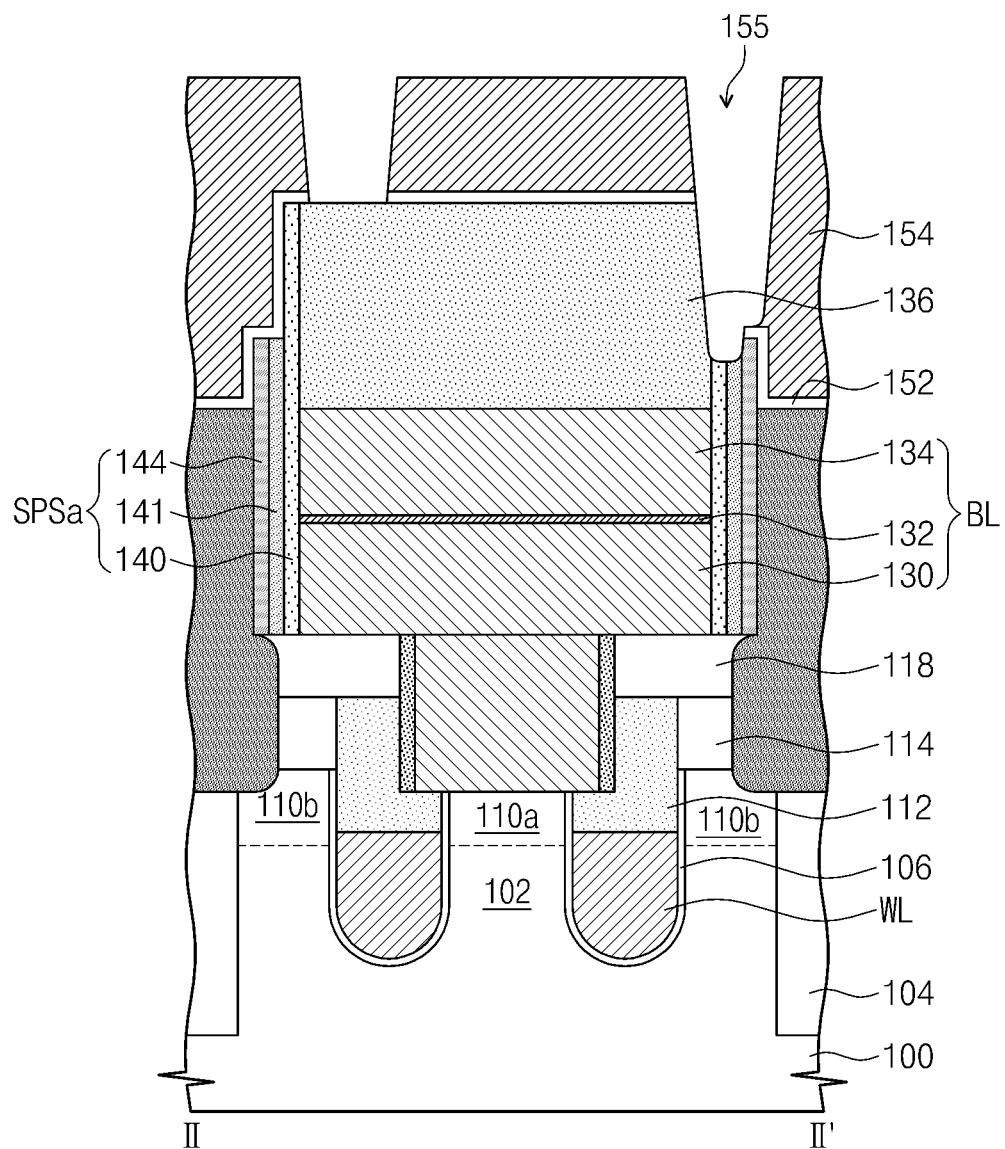

Referring to FIGS. 11A, 11B, and 11C, an additional etching process may be performed to expose a top portion of the sacrificial spacer 141. Here, the additional etching process may be performed using an etchant that is capable of selectively etching silicon nitride at a high etch rate and suppressing or preventing other materials from being etched.

For example, the sacrificial spacer 141 may include silicon oxide, and the hard mask pattern 136 and the first and second spacers 140 and 144, which are adjacent to the sacrificial spacer 141, may be formed of or include silicon nitride. In the case where the etchant capable of selectively etching silicon nitride is used, it is possible to more easily etch a region adjacent to the hard mask pattern 136, compared with the landing pad 154 made of a metal. Accordingly, the hard mask pattern 136 may be etched in an inward direction, and as a result, an opening 155 may be formed to have a second depth d2 greater than the first depth d1. The second depth d2 may be a depth, at which the top portion of the sacrificial spacer 141 is exposed. In certain embodiments, the upper portions of the barrier layer 152 and the sacrificial spacer 141 may be further etched. Thereafter, the mask pattern M1 may be removed.

Figure 12A:
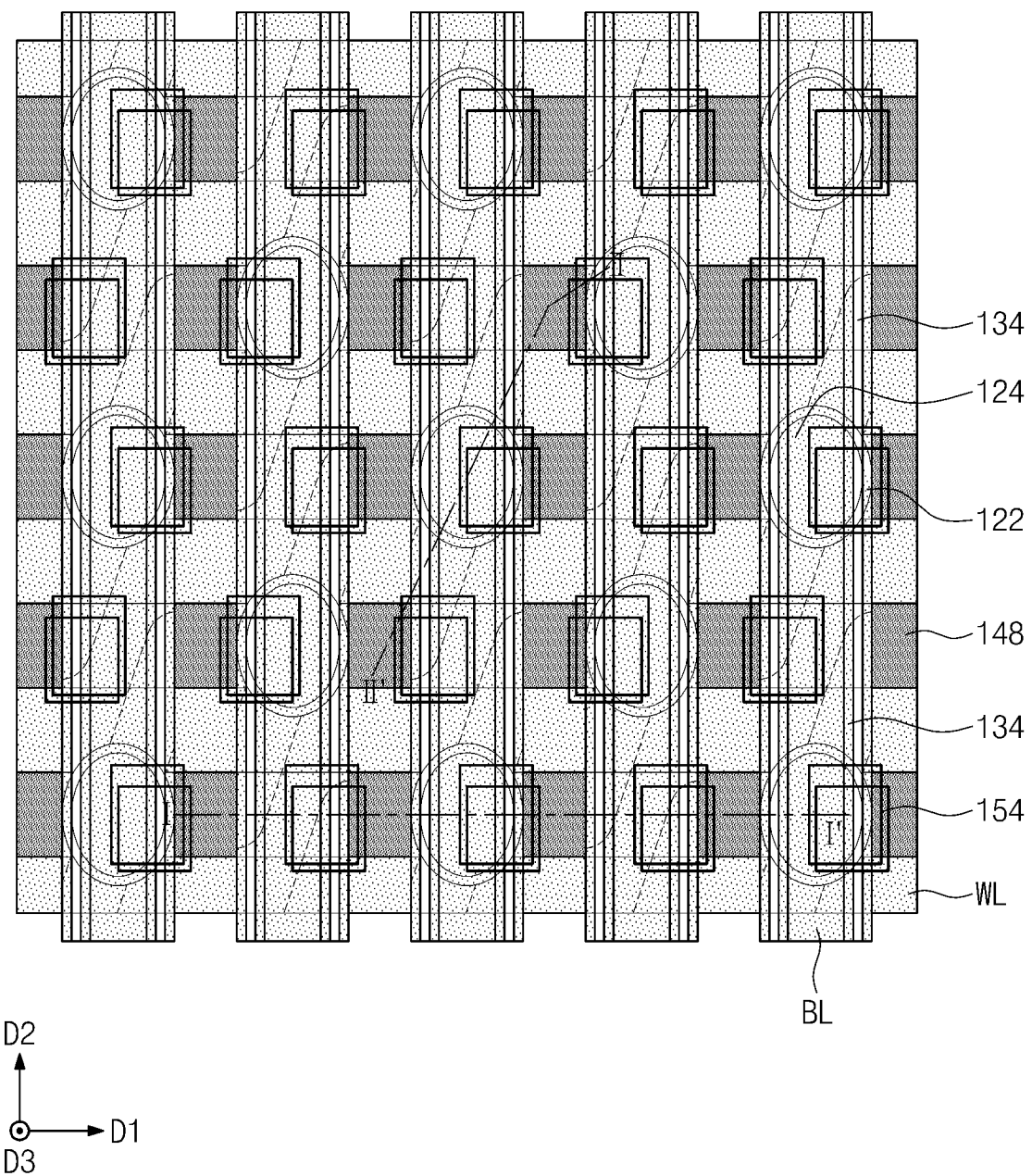
Figure 12B:
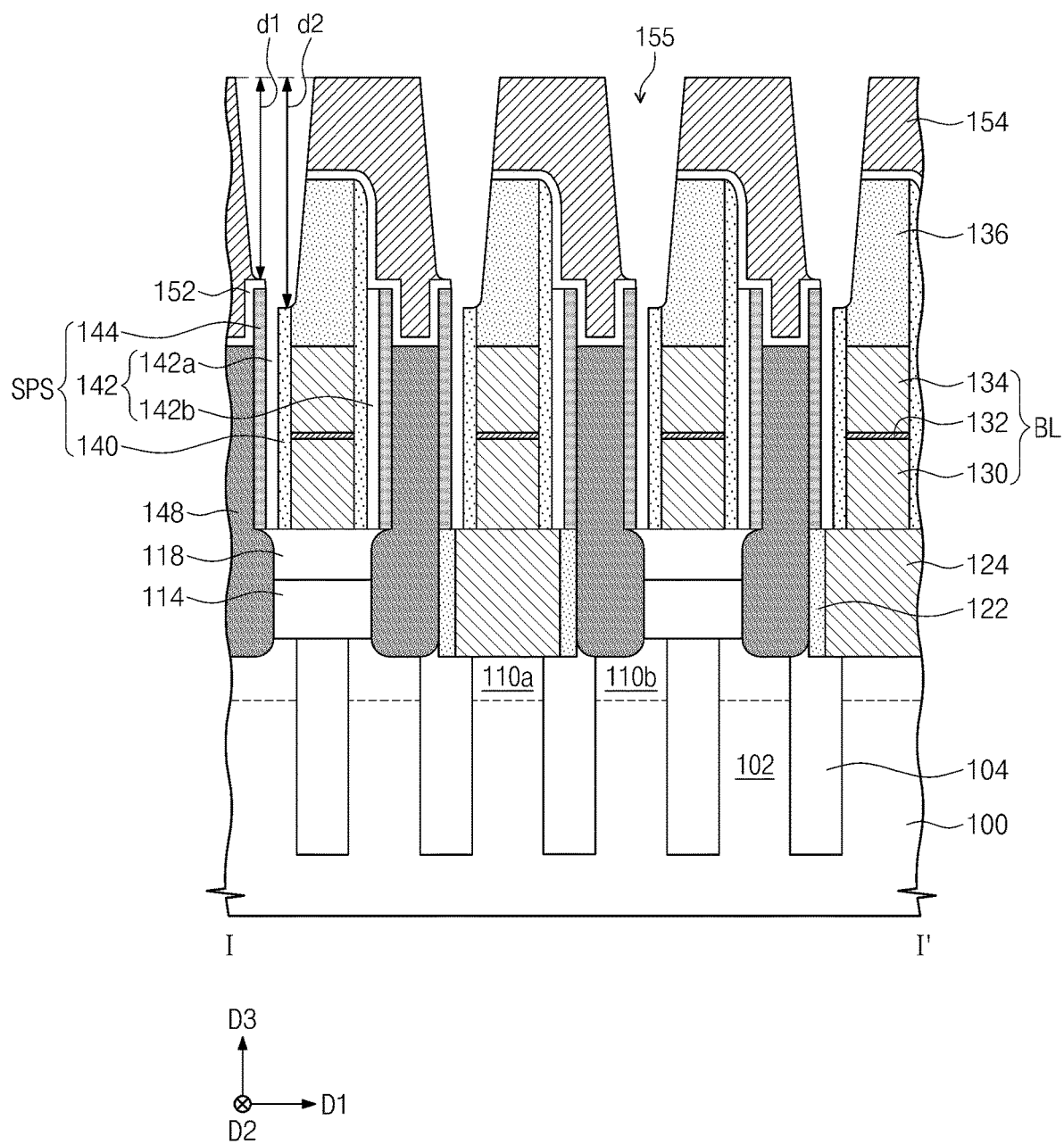
Figure 12C:
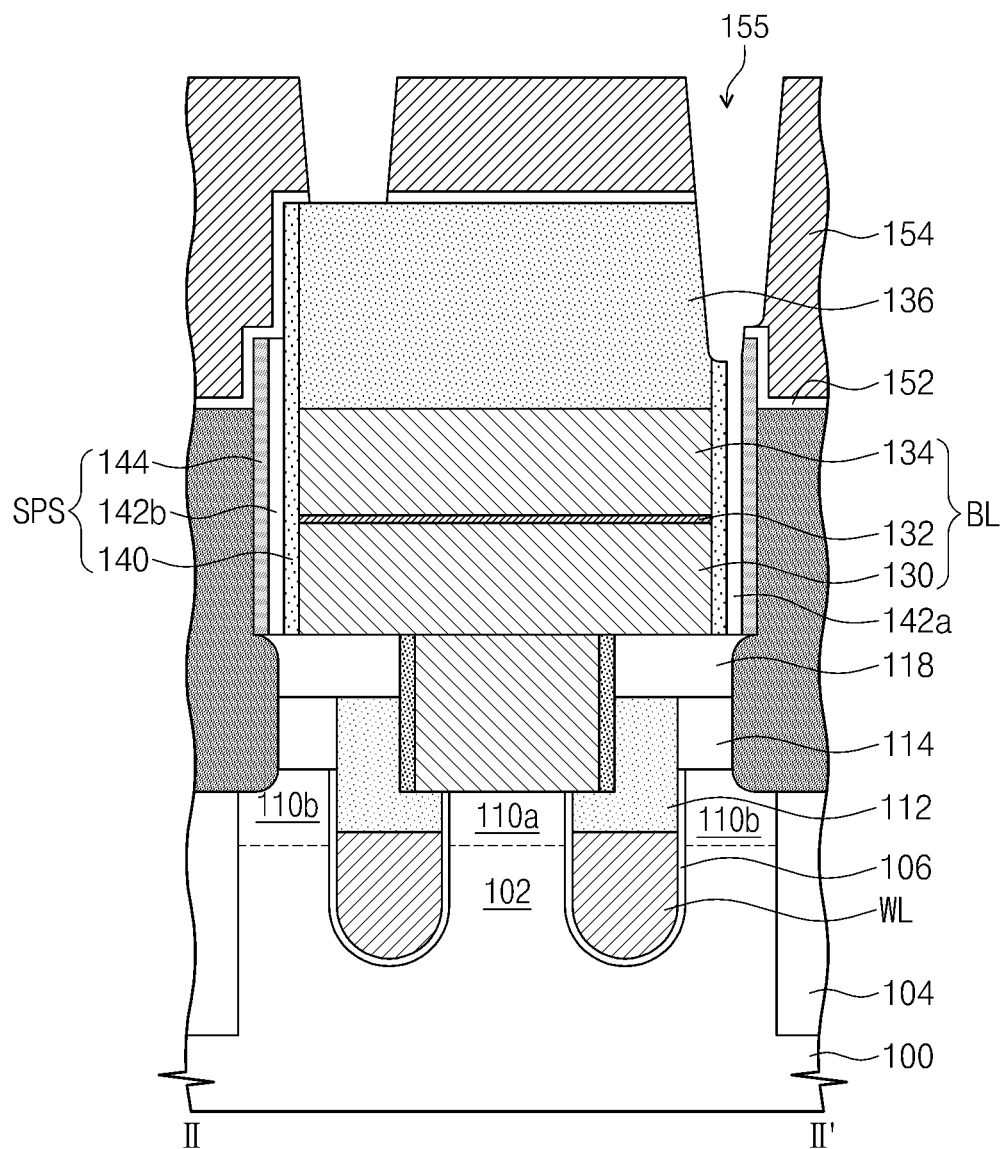

Referring to FIGS. 12A, 12B, and 12C, the sacrificial spacer 141 may be etched. As an example, the sacrificial spacer 141 may be etched using an etchant capable of selectively etching silicon oxide. As described above, the sacrificial spacer 141 may include silicon oxide, and the hard mask pattern 136 and the first and second spacers 140 and 144, which are adjacent to the sacrificial spacer 141, may be formed of or include silicon nitride. In the case where the etchant capable of selectively etching silicon oxide is used, it is possible to selectively remove the sacrificial spacer 141. As a result of the removal of the sacrificial spacer 141, an air spacer 142 may be formed between the first and second spacers 140 and 144. For ease of differentiation, the first and second spacers 140 and 144 may be referred to herein as material spacers, to contrast with an air spacer (e.g., as first and second spacers 140 and 144 include a solid material). When viewed in a plan view, the air spacer 142 may extend in the second direction D2 and may have a linear shape. When viewed in a vertical section parallel to the word line WL, the air spacer 142 may include first and second air spacers 142a and 142b, whose heights are different from each other. For example, the first air spacer 142a may be formed to have a height smaller than that of the second air spacer 142b.

Referring back to FIGS. 1A, 1B, and 1C, an insulating pattern 156 may be formed to fill the opening 155.

The insulating pattern 156 may be formed by sequentially performing at least two deposition processes. In detail, a first deposition process may be performed to cover an upper region of the air spacer 142, and then, a second deposition process may be performed to cover an inner region of the opening 155. In some embodiments, the first deposition process may be performed to realize low conformality, compared with that in the second deposition process. The difference in conformality between the first and second deposition processes may make it possible to reduce a difference in height between the first and second air spacers 142a and 142b. The first and second deposition processes may be performed to form a silicon nitride layer or a silicon oxynitride layer. The first and second deposition processes may be performed using first and second process gases, respectively, and here, an amount of silane-based gas in the first process gas may be greater than that in the second process gas and an amount of ammonia-based gas in the first process gas may be less than that in the second process gas. The second deposition process may be performed to conformally form an insulating layer, and then, a planarization process may be performed to allow the insulating layer to have a top surface coplanar with that of the landing pad 156. In one embodiment, a bottom surface of the insulating pattern 156 may define a top surface of the air spacer 142. In certain embodiments, the insulating pattern 156 may be formed by a single deposition process. It should be noted that although the air spacer 142 is filled with air, it may be described as having surfaces (e.g., top surface, bottom surface), at the locations where it ends (e.g., its boundary with other solid structures).

Referring back to FIGS. 1B and 1D, the insulating pattern 156 may include a first portion 156a and a second portion 156b having two different depths d1 and d2. As an example, the first portion 156a may be formed to have a first depth d1, and the second portion 156b may be formed to have a second depth d2 greater than the first depth d1. For example, the second depth d2 may be greater by about 50 Å to about 500 Å than the first depth d1. When viewed in a plan view, the second portion 156b may overlap the first air spacer 142a and may be closer to the bit line structures BLS than the first portion 156a. The bottom surface of the second portion 156b may be rounded where it forms a boundary with the first air spacer 142a. The insulating pattern 156 may be in contact with the bit line structure BLS exposed by the opening 155. For example, the second portion 156b of the insulating pattern 156 may be in contact with the recessed portion of the hard mask pattern 136.

Thereafter, data storage patterns DSP may be formed on the landing pads 154, respectively. The data storage patterns DSP may be electrically connected to the second impurity regions 110b, respectively, through the contact plugs 148. In some embodiments, the data storage pattern DSP may be a capacitor. In certain embodiments, the data storing pattern DSP, which includes one of magnetic tunnel junctions, transition metal oxides, or phase-changeable materials, may be formed on the contact plugs 148, respectively.

According to some embodiments of the inventive concept, an etching process may be performed to etch a fourth conductive layer and to define the landing pads 154, and then, an additional etching process may be performed to expose the sacrificial spacer 141. Thereafter, the sacrificial spacer 141 may be etched to form the air spacer 142. Here, the additional etching process may be performed in an in-situ manner (e.g., without removing the substrate from a chamber and/or without a vacuum break). The etching process and the additional etching process may be performed using the same recipe or different recipes. Thereafter, the insulating pattern 156 may be formed to cover an upper portion of the first air spacer 142a. According to some embodiments of the inventive concept, it is possible to increase a contact margin of the landing pad 154 and to reduce capacitance between bit lines. This may make it possible to fabricate a highly reliable semiconductor device.

In the fabrication method described above, a portion of a mold layer (not shown) for a contact hole may be directly etched, and the contact plug 148 may be formed in the contact hole. However, in certain embodiments, the contact plug 148 may be formed by a replacement process including, for example, at least one deposition step and at least one etching step. By controlling an etching amount or etch selectivity of the at least one etching step, it is possible to selectively collapse at least a portion of the spacer structure or prevent such a collapse of the spacer structure. As a result of the etching of the spacer structure, the spacer structure may have a non-uniform height in the second direction D2.

Figure 13:
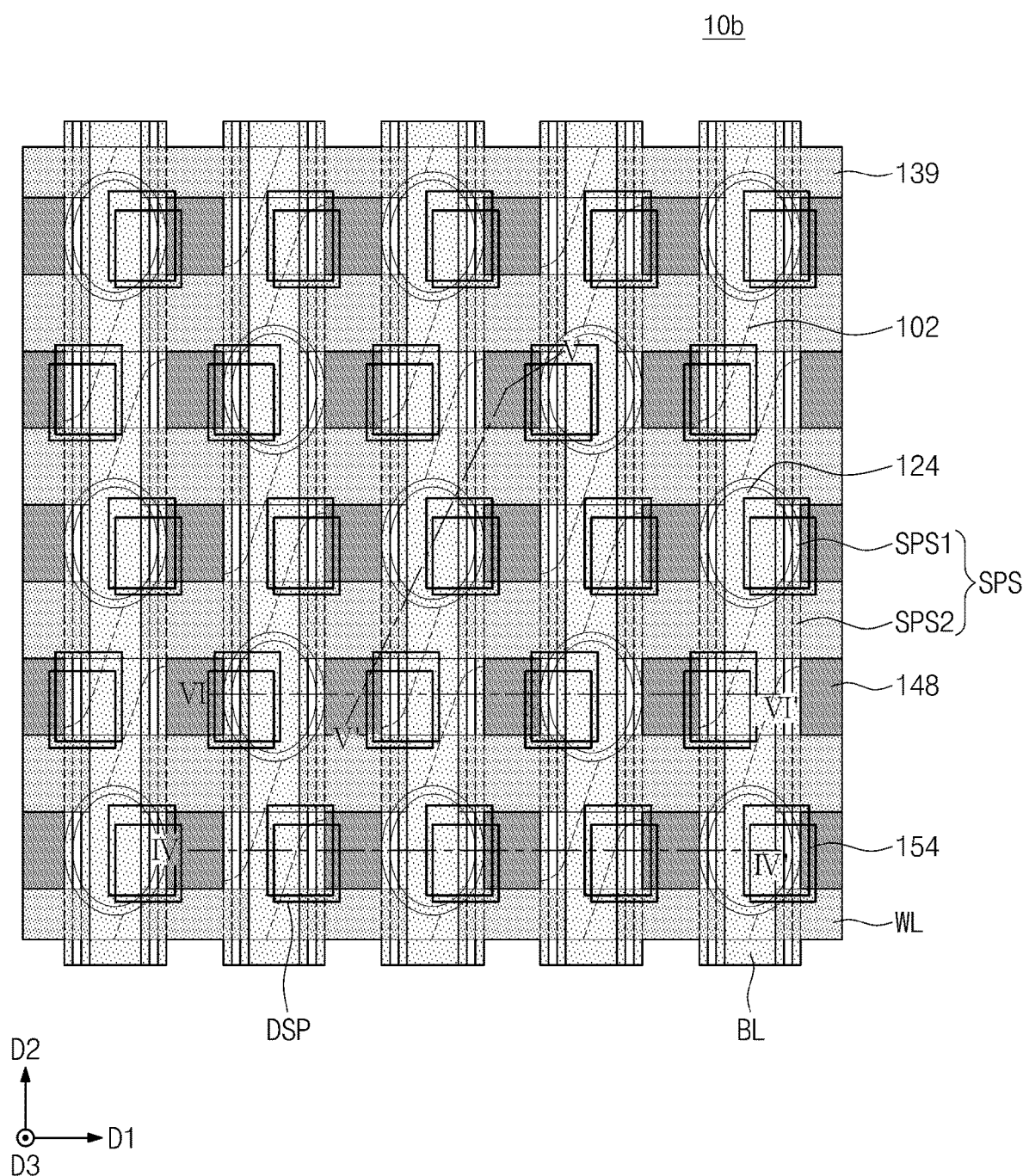
FIG. 13 is a plan view illustrating a semiconductor device according to some embodiments of the inventive concept.

FIG. 13 is a plan view illustrating a semiconductor device according to some embodiments of the inventive concept. In the following description, substantially the same element as any of the semiconductor device 10a previously described with reference to FIGS. 1A to 1D may be identified by a similar or identical reference number without repeating an overlapping description thereof. Sections taken along lines IV-IV', V-V', and VI-VI' of FIG. 13 may correspond to those of FIGS. 1B, 1C, and 1D. In FIG. 13, underlying elements are depicted by a dotted line.

A semiconductor device 10b may have a spacer structure SPS including a first spacer structure SPS1 and a second spacer structure SPS2. The first and second spacer structures SPS1 and SPS2 may be different from each other in terms of their vertical heights. In some embodiments, the second spacer structure SPS2 may have a vertical height smaller than that of the first spacer structure SPS1. For example, the semiconductor device 10b may include a mold pattern 139, which is positioned above the second spacer structure SPS2 and is in contact with at least a portion of the bit line BL. The spacer structure SPS may be a line-shaped structure continuously extending in the second direction D2 but may have at least two different vertical heights along the second direction D2. For example, the second spacer structure SPS2 may have a vertical height smaller than that of the first spacer structure SPS1, and this may make it possible to decrease a total area of an air spacer and prevent process failures caused by the barrier layer 152. As an example of the process failures caused by the barrier layer 152, a cleaning step may be performed on an interface of the contact plug 148 before the formation of the landing pad 154, and here, the cleaning step may be performed to expose the upper portion of the second spacer structure SPS2, and as a result, the sacrificial spacer 141 may be partially etched to form a gap region. In this case, the barrier layer 152 may be formed in the gap region, thereby causing a short circuit or bridge between the contact plugs 148. According to some embodiments of the inventive concept, it is possible to prevent this technical issue from occurring.

According to some embodiments of the inventive concept, it is possible to increase a contact margin of the landing pad 154 and to reduce capacitance between.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a gate structure on a substrate;
   first and second impurity regions formed in the substrate and at opposite sides of the gate structure, respectively;
   a conductive line structure provided to cross over the gate structure and connected to the first impurity region, the conductive line structure having a left sidewall and a right sidewall opposite to each other;
   a left spacer structure on the left sidewall of the conductive line structure;
   a right spacer structure on the right sidewall of the conductive line structure;
   a barrier layer conformally covering the conductive line structure, the left spacer structure, and the right spacer structure; and
   an insulating pattern penetrating a portion of the barrier layer and a portion of the conductive line structure to be in contact with the left spacer structure,
   wherein the left spacer structure includes:
   a first left material spacer contacting a lower portion of the left sidewall of the conductive line structure and exposing an upper portion of the left sidewall of the conductive line structure;
   a second left material spacer spaced apart from the first left material spacer; and
   a left air spacer between the first left material spacer and the second left material spacer,
   wherein the insulating pattern includes:
   a first portion contacting a top surface of the barrier layer vertically overlapping the second left material spacer; and
   a second portion contacting a top surface of the first left material spacer and defining a top end of the left air spacer, and
   wherein a lowermost end of the second portion contacts a top surface of the second left material spacer and is lower than a lowermost end of the first portion.

2. The semiconductor device of claim 1, wherein the right spacer structure includes:
   a first right material spacer contacting the right sidewall of the conductive line structure;
   a second right material spacer spaced apart from the first right material spacer; and
   a right air spacer between the first right material spacer and the second right material spacer, and
   wherein upper ends of the second right material spacer and the right air spacer are lower than an upper end of the first right material spacer.

3. The semiconductor device of claim 1, wherein an upper end of the second left material spacer is higher than an upper end of the first left material spacer.

4. The semiconductor device of claim 1, wherein the right spacer structure includes:
   a first right material spacer contacting the right sidewall of the conductive line structure;
   a second right material spacer spaced apart from the first right material spacer; and
   a right air spacer between the first right material spacer and the second right material spacer, and
   wherein a level of an upper end of the second right material spacer is substantially the same as a level of an upper end of the second left material spacer.

5. The semiconductor device of claim 4, wherein an upper end of the first right material spacer is higher than the first left material spacer.

6. The semiconductor device of claim 4, wherein a level of an upper end of the right air spacer is higher than or equal to a level of an upper end of the left air spacer.

7. The semiconductor device of claim 4, wherein a level of an upper end of the second right material spacer is substantially the same as a level of the right air spacer.

8. A semiconductor device, comprising:
   a gate structure on a substrate;
   first and second impurity regions formed in the substrate and at opposite sides of the gate structure, respectively;
   a conductive line structure provided to cross over the gate structure and connected to the first impurity region, the conductive line structure having a left sidewall and a right sidewall opposite to each other;
   a left spacer structure on the left sidewall of the conductive line structure;
   a right spacer structure on the right sidewall of the conductive line structure; and
   a barrier layer conformally covering the conductive line structure, the left spacer structure and the right spacer structure,
   wherein the left spacer structure includes:
   a first left material spacer contacting a lower portion of the left sidewall of the conductive line structure and exposing an upper portion of the left sidewall of the conductive line structure;
   a second left material spacer spaced apart from the first left material spacer; and
   a left air spacer between the first left material spacer and the second left material spacer,
   wherein the right spacer structure includes:
   a first right material spacer contacting the right sidewall of the conductive line structure;
   a second right material spacer spaced apart from the first right material spacer; and
   a right air spacer between the first right material spacer and the second right material spacer,
   wherein upper ends of the second right material spacer and the right air spacer are lower than an upper end of the first right material spacer, and
   wherein the barrier layer contacts an upper sidewall of the first right material spacer.

9. The semiconductor device of claim 8, further comprising an insulating pattern penetrating a portion of the barrier layer and a portion of the conductive line structure to be in contact with the left spacer structure,
   wherein the insulating pattern includes:
   a first portion contacting a top surface of the barrier layer vertically overlapping the second left material spacer; and
   a second portion contacting a top surface of the first left material spacer and defining a top end of the left air spacer, and
   wherein a lowermost end of the second portion is lower than a lowermost end of the first portion.

10. The semiconductor device of claim 8, wherein an upper end of the second left material spacer is higher than an upper end of the first left material spacer.

11. The semiconductor device of claim 8, wherein a level of an upper end of the second right material spacer is substantially the same as a level of an upper end of the second left material spacer.

12. The semiconductor device of claim 8, wherein an upper end of the first right material spacer is higher than the first left material spacer.

13. The semiconductor device of claim 8, wherein a level of an upper end of the right air spacer is higher than or equal to a level of an upper end of the left air spacer.

14. The semiconductor device of claim 8, wherein a level of an upper end of the second right material spacer is substantially the same as a level of the right air spacer.

15. A semiconductor device, comprising:
- a gate structure on a substrate;
- first and second impurity regions formed in the substrate and at opposite sides of the gate structure, respectively;
- a conductive line structure provided to cross over the gate structure and connected to the first impurity region, the conductive line structure having a left sidewall and a right sidewall opposite to each other;
- a left spacer structure on the left sidewall of the conductive line structure;
- a right spacer structure on the right sidewall of the conductive line structure; and
- wherein the left spacer structure includes:
- a first left material spacer contacting a lower portion of the left sidewall of the conductive line structure and exposing an upper portion of the left sidewall of the conductive line structure;
- a second left material spacer spaced apart from the first left material spacer; and
- a left air spacer between the first left material spacer and the second left material spacer,
- wherein the right spacer structure includes:
- a first right material spacer contacting the right sidewall of the conductive line structure;
- a second right material spacer spaced apart from the first right material spacer; and
- a right air spacer between the first right material spacer and the second right material spacer,
- wherein an upper end of the second left material spacer is higher than an upper end of the first left material spacer, and
- wherein a level of an upper end of the second right material spacer is substantially the same as a level of an upper end of the second left material spacer.

16. The semiconductor device of claim 15, further comprising:
- a barrier layer conformally covering the conductive line structure, the left spacer structure and the right spacer structure,
- wherein upper ends of the second right material spacer and the right air spacer are lower than an upper end of the first right material spacer, and
- wherein the barrier layer contacts an upper sidewall of the first right material spacer.

17. The semiconductor device of claim 15, further comprising:
- a barrier layer conformally covering the conductive line structure, the left spacer structure and the right spacer structure; and
- an insulating pattern penetrating a portion of the barrier layer and a portion of the conductive line structure to be in contact with the left spacer structure,
- wherein the insulating pattern includes:
- a first portion contacting a top surface of the barrier layer vertically overlapping the second left material spacer; and
- a second portion contacting a top surface of the first left material spacer and defining a top end of the left air spacer, and
- wherein a lowermost end of the second portion is lower than a lowermost end of the first portion.

18. The semiconductor device of claim 15, wherein an upper end of the first right material spacer is higher than the first left material spacer.

19. The semiconductor device of claim 15, wherein a level of an upper end of the right air spacer is higher than or equal to a level of an upper end of the left air spacer.

20. The semiconductor device of claim 15, wherein a level of an upper end of the second right material spacer is substantially the same as a level of the right air spacer.

* * * * *